United States Patent
Phatak et al.

(10) Patent No.: US 11,314,907 B2
(45) Date of Patent: Apr. 26, 2022

(54) SIMULATION INCLUDING MULTIPLE SIMULATORS

(71) Applicant: Hitachi, Ltd., Tokyo (JP)

(72) Inventors: Sujit S Phatak, Farmington Hills, MI (US); Herning Chen, Novi, MI (US); Yuan Xiao, Farmington Hills, MI (US); Can Wang, Farmington, MI (US)

(73) Assignee: HITACHI, LTD., Tokyo (JP)

( * ) Notice: Subject to any disclaimer, the term of this patent is extended or adjusted under 35 U.S.C. 154(b) by 195 days.

(21) Appl. No.: 15/247,978

(22) Filed: Aug. 26, 2016

(65) Prior Publication Data

US 2018/0060456 A1    Mar. 1, 2018

(51) Int. Cl.
*G06F 30/20* (2020.01)
*G06F 9/50* (2006.01)
*G06F 30/15* (2020.01)

(52) U.S. Cl.
CPC ............ *G06F 30/20* (2020.01); *G06F 9/5027* (2013.01); *G06F 9/5077* (2013.01); *G06F 30/15* (2020.01)

(58) Field of Classification Search
CPC .... G06F 17/5009; G06F 17/50; G06F 9/5027; G06F 9/50; G06F 30/20; G06F 30/15; G06F 9/77; C06F 9/5027; C06F 9/5077
See application file for complete search history.

(56) References Cited

U.S. PATENT DOCUMENTS

| | | | |
|---|---|---|---|
| 7,987,075 B2 | 7/2011 | Sugure et al. | |
| 8,700,379 B2 | 4/2014 | Ishikawa et al. | |
| 9,037,448 B2 | 5/2015 | Ito et al. | |
| 9,075,939 B2 | 7/2015 | Phatak et al. | |
| 2006/0288168 A1* | 12/2006 | Stevenson | G06F 9/4451 711/115 |
| 2008/0052049 A1* | 2/2008 | Moriyama | G06F 30/20 703/2 |

(Continued)

OTHER PUBLICATIONS

Ogasawara, Eduardo, et al. "Exploring many task computing in scientific workflows." Proceedings of the 2nd Workshop on Many-Task Computing on Grids and Supercomputers. ACM, 2009. (Year: 2009).*

(Continued)

*Primary Examiner* — Boris Gorney
*Assistant Examiner* — Joshua E. Jensen
(74) *Attorney, Agent, or Firm* — Mattingly & Malur, PC

(57) ABSTRACT

In some examples, one or more computing devices on a network may receive, from a client computing device, one or more inputs for configuring a simulation, the simulation including at least a first simulator and a second simulator. The one or more computing devices may allocate computing resources including at least a first virtual machine for executing at least one of the first simulator or the second simulator. The one or more computing devices may configure a first simulation controller executable on the first virtual machine for controlling execution of the at least one of the first simulator or the second simulator. The first simulation controller may initiate execution of at least one of the first simulator or the second simulator as part of execution of the co-simulation. In some examples, a result of the co-simulation may be sent to the client computing device.

19 Claims, 27 Drawing Sheets

(56) References Cited

U.S. PATENT DOCUMENTS

| | | | |
|---|---|---|---|
| 2008/0133202 A1* | 6/2008 | Tseng | G06F 17/5036 703/14 |
| 2009/0306952 A1* | 12/2009 | Kajitani | G06F 30/33 703/13 |
| 2010/0030525 A1* | 2/2010 | Dong | G06F 30/15 703/1 |
| 2012/0123764 A1* | 5/2012 | Ito | G06F 9/5055 703/21 |
| 2012/0143518 A1* | 6/2012 | Kim | G05B 23/0251 702/33 |
| 2013/0151220 A1* | 6/2013 | Matsumura | G06F 11/261 703/7 |
| 2014/0013211 A1* | 1/2014 | Sakata | G06F 17/2247 715/235 |
| 2014/0156233 A1 | 6/2014 | Wang et al. | |
| 2015/0026342 A1 | 1/2015 | Chen et al. | |
| 2015/0127192 A1 | 5/2015 | Phatak et al. | |
| 2015/0370584 A1* | 12/2015 | Ito | G06F 21/125 703/26 |
| 2015/0370956 A1 | 12/2015 | Xiao et al. | |
| 2016/0033952 A1* | 2/2016 | Schroeter | G05B 19/41885 700/108 |
| 2017/0024500 A1* | 1/2017 | Sebastian | G06F 30/20 |
| 2017/0054574 A1* | 2/2017 | Wu | H04L 12/4641 |
| 2017/0126711 A1* | 5/2017 | Jung | H04L 63/1425 |

OTHER PUBLICATIONS

Phatak, Sujit S., et al. Virtual Multi-ECU High Fidelity Automotive System Simulation. No. 2016-01-0013. SAE Technical Paper, 2016. (Year: 2016).*

Zeller, Marc, et al. "Co-simulation of self-adaptive automotive embedded systems." 2010 IEEE/IFIP International Conference on Embedded and Ubiquitous Computing. IEEE, 2010. (Year: 2010).*

Sirer, Emin Gun, et al. "Distributed virtual machines: A system architecture for network computing." Proceedings of the 8th ACM SIGOPS European workshop on Support for composing distributed applications. 1998. (Year: 1998).*

Karner, Michael, et al. "Verification and analysis of dependable automotive communication systems based on HW/SW co-simulation." 2008 IEEE International Conference on Emerging Technologies and Factory Automation. IEEE, 2008. (Year: 2008).*

* cited by examiner

SIMULATION INCLUDING MULTIPLE SIMULATORS

BACKGROUND

Over the past few decades, vehicles have been transformed from primarily mechanical devices to integrated electro-mechanical devices with embedded software in all major systems, such as engine control, powertrain, suspension, braking, safety, and entertainment. As one example, vehicles today include a complex network of electronic control units (ECUs) connected for communication with each other using any of several different network implementations such as Controller Area Network (CAN), which may include high speed CAN and low speed or fault tolerant CAN. There may be a large number of ECUs included in a vehicle, with particular ECUs being programmed for specific applications such as engine, transmission, body, steering, brakes, infotainment/navigation, etc. For instance, vehicles may include 50 to more than 100 ECUs, together executing more than 50 million lines of software code. Further, these numbers are expected to increase substantially in the coming years as vehicles become increasingly autonomous.

Such complex electric/electronic (E/E) architecture and software may call for a comprehensive, flexible, and systematic development and validation environment, especially for system level or vehicle level development. For instance, to stay competitive, manufacturers generally desire to reduce development cycles for improving time to market, and may further desire to use common platforms in order to achieve economies of scale. The increasing use of electronic parts in modern vehicles introduces complexity, which, if not tested and verified during the design phase, can lead to reduced reliability and higher incidence of recalls, which may be particularly troublesome if occurring on a common platform used for a number of different vehicle models. Accordingly, software testing is desirable during the development process for all electronic systems.

Furthermore, automotive design engineering teams are tasked to perform increasingly complex tests and simulations in an integrated environment, but existing tools have not kept up with this challenge. For example, simple, homogeneous co-simulations may be accomplished using multiple tools from one simulator vendor or, in select cases, a few tools from multiple simulator vendors. In a co-simulation, multiple different components or subsystems that form a coupled problem may be modeled and simulated in a distributed manner. The modeling may be done on a component or subsystem level independently of any particular coupled problem. During the co-simulation, the models may send data to and/or receive data from other models to simulate interactions of the different components or subsystems. However, such co-simulations may often be executed on personal computers (PCs), which may not be optimally configured for performing simulation processing. Additionally, the data entry and setup requirements for executing heterogeneous co-simulations that include multiple simulations of different types may typically be laborious and time-consuming. Consequently, conventional co-simulation options tend to be limited in the number of simulators that can be used, and may be further limited to low fidelity simulations and/or simple system designs.

SUMMARY

Some implementations include arrangements and techniques for performing simulations, such as co-simulations that include concurrent execution of multiple simulators. For instance, one or more computing devices on a network may receive, from a client computing device, one or more inputs for configuring a simulation, the simulation including at least a first simulator and a second simulator. The one or more computing devices may allocate computing resources including at least a first virtual machine for executing at least one of the first simulator or the second simulator. A first simulation controller executable on the first virtual machine may be configured for controlling execution of the at least one of the first simulator or the second simulator. The first simulation controller may initiate execution of the at least one of the first simulator or the second simulator as part of execution of the co-simulation. A result of the co-simulation may be sent to the client computing device.

As another example, the one or more computing devices may receive, from a client computing device, an instruction to create a simulation including a first simulator, a second simulator, and a third simulator. In addition, the one or more computing devices may receive, from the client computing device, an indication of a first model file executable on the first simulator, a second model file executable on the second simulator, and a third model file executable on the third simulator. The one or more computing devices may determine that the third model file is executable on the first simulator, and may consolidate the first model file and the third model file into a consolidated model file. The one or more computing devices may execute the simulation by executing the consolidated model file on the first simulator and the second model file on the second simulator.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
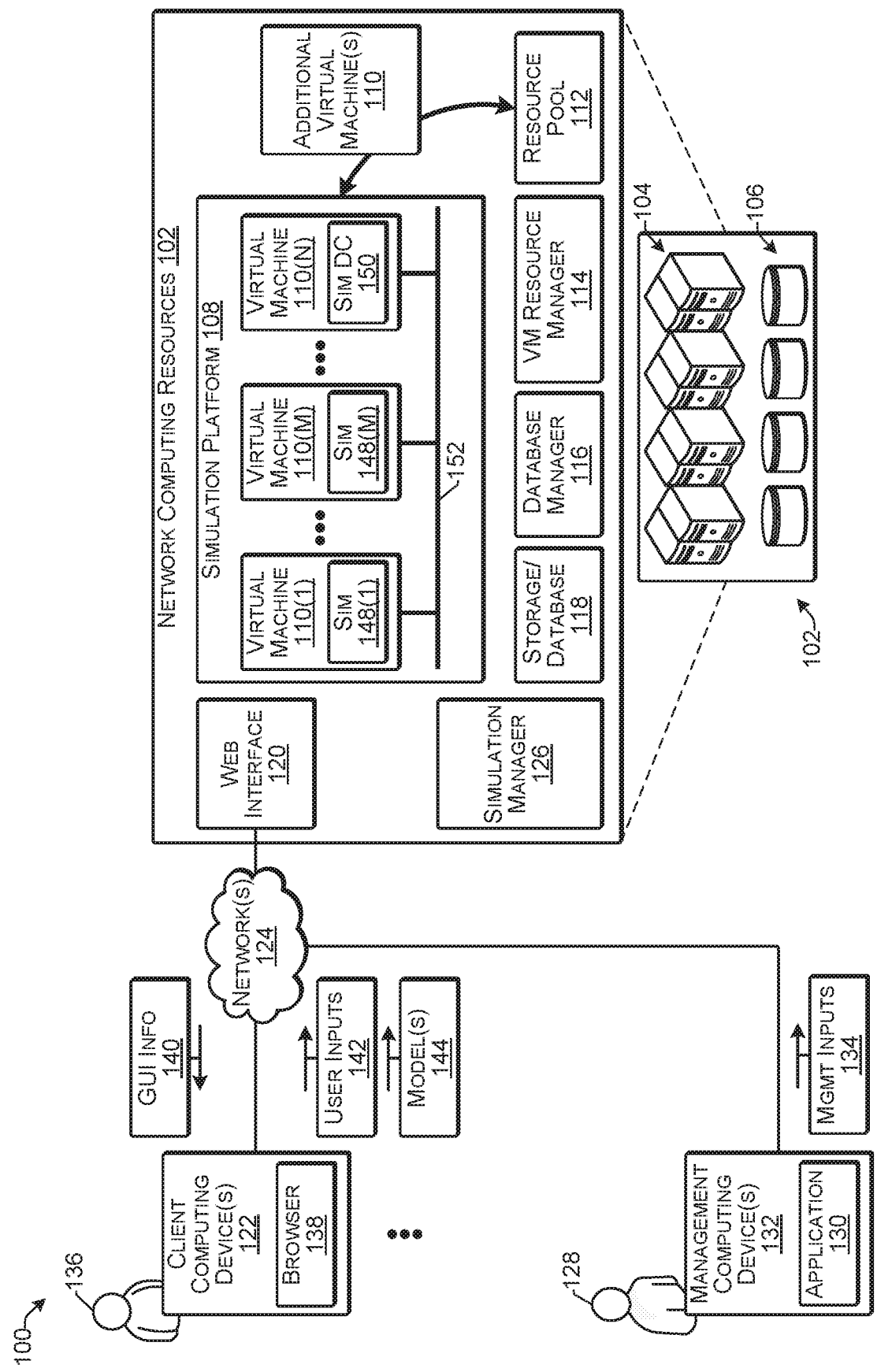
FIG. 1 illustrates an example architecture of a system for scalable simulation according to some implementations.

Some implementations herein are directed to techniques and arrangements for a network-based simulation platform that is able to emulate a realistic hardware-based automotive embedded system. For instance, the simulation platform includes a graphic user interface that enables a user to configure simulators for co-execution on plurality of computing devices, such as a plurality of virtual machines configured on network computing resources. In some examples, the concurrent execution of the simulators may be controlled by a simulation controller that manages workers executing respective simulators on a simulation node. A simulation execution worker executing on a simulation manager node may coordinate a simulation process across one or more participating simulation nodes.

Furthermore, in some examples, prior to execution of a simulation, a plurality of models to be used in the simulation may be automatically consolidated. For instance, the simulation platform may enable the use of proprietary simulators that may require payment of non-trivial license fees. Thus, implementations herein may perform consolidation of multiple small models into a single larger model to reduce the number of licenses used during a simulation. A model consolidation master program may determine models that use the same license, may remove headers from the models, and may generate a wrapper for the respective core definitions of the multiple models, such as to enable sequential execution of the multiple models during the simulation.

In addition, some examples may include the ability to enable an automated parameter sweep. For instance, a user may desire to test out a system with different sets of parameters, such as for determining optimal performance for the system. Thus, the simulation platform herein may enable automated generation of parameter sets for each parameter of one or more parameters that a user would like to apply to a simulation. The simulation platform may instantiate selected models with the generated parameter sets to provide an automated parameter sweep of specified parameters during the simulation, such as based on a minimum to maximum range with an incremental step size or based on a list of discrete values. Further, the simulation platform may run models instantiated with different parameter sets in parallel, by deploying simulations using the different parameters onto different virtual machines. Additionally, the simulation platform may enable multiple-model and multiple-parameter parameter sweeps such as for testing various combinations of multiple parameters.

In some cases, the simulation platform may be used to configure and execute simulations that include concurrent execution of multiple simulators of different types. For example, the simulation platform may enable simulating the function of individual components, simulating the interaction of multiple different components, simulating systems, simulating multiple systems, simulating entire vehicles, or the like. The simulation platform may establish a proper connection type between selected simulators for simulating the real-world connection between the corresponding real-world components. Further, the simulation platform may provide pre-configured simulations that a user may employ with one or more models prepared by the user for achieving a testing goal, validation, or the like.

In some examples, the simulation platform may enable creation of co-simulations of multiple ECUs and associated components and systems for producing simulations on a vehicle level. The simulation platform allows design optimization of vehicle systems by allowing virtual experimentation, testing, and comparison of different E/E architectures with respect to multiple virtual ECUs (vECUs) and other simulated components or systems. The simulation platform herein further enables testing and comparing the performance of microcontrollers and hardware components. The simulation platform herein may be configured to support a vehicle-level simulation, which may enable component-level, system-level, and vehicle-level software development very early in the design stage of a vehicle, and which may substantially reduce the overall development time for the vehicle.

In some examples, a virtual CAN bus may be configured as a co-simulation bus built on TCP/IP (Transmission Control Protocol/Internet Protocol). Thus, a plurality of different vECUs and other simulator models may be configured on a plurality of different virtual and/or physical computing devices, and may be able to communicate using CAN protocol over the virtual CAN bus despite being deployed on different virtual and/or physical computing devices. Furthermore, implementations herein include a virtual CAN router that may be provided to manage some CAN traffic on the virtual CAN bus. For instance, the virtual CAN router may be executed on a separate vECU and may receive and send vehicle level CAN traffic over various network configurations including Ethernet, fiber optic, and so forth. As one example, the vECU that executes the CAN router may be connected to two different layers of simulation, one with lower fidelity at a vehicle level, and one with higher fidelity at a system level.

The simulation platform herein may be implemented using a plurality of computing devices, such as a plurality of physical machines and/or a plurality of virtual machines configured on network computing resources (sometimes referred to as cloud computing resources), which may be accessed over the Internet or other network. For example, as implemented on the network computing resources, the simulation platform herein may be able to expand to virtually any desired scale, and therefore may be used to simulate some or all of the ECUs in a vehicle, as well as other vehicle components and subsystems. Thus, the simulation platform enables users, such as design teams, to conduct complex, high-fidelity, large-scale, system-level and vehicle-level co-simulations.

Furthermore, the simulation platform herein includes simplified simulation setup, initiation, and output functionality to enable large-scale high-fidelity co-simulations. For instance, users may access the simulation platform via a web portal and may use a graphic user interface (GUI) that provides step-by-step instructions to a user for creating a simulation. Thus, the web portal may provide anytime anywhere access to high-performance computing (HPC) power for running simulations. Further, users might not have any specialized software installed on their own computers to run a simulation, but instead may use a browser to access the simulation platform. Implementations herein may support a variety of different simulators and languages, multiple solvers within a particular simulator, multiple domains and physics, and multiple abstraction levels. In examples herein, this functionality may be available in an HPC cloud environment, providing scalability, performance, and simulation software license management for heterogeneous co-simulations.

In addition, users may concurrently test models with different abstraction levels, including the testing of multiple high-fidelity microcontroller model-based vECUs. This level of abstraction makes possible large-scale testing of complex virtual system-level and vehicle-level simulations. Additionally, the use of network computing resources may provide users with access to HPC power and enables distribution of workloads across virtual machines, which further enhances the efficiency of the system-level and vehicle-level simulations.

Following set up of a simulation, users may enter a simulation end time and simulation step size once, and this information may be applied as a global setting to all simulators being used in the simulation. A GUI providing automations incorporated into the simulation platform may significantly simplify setup and save the user considerable setup time, particularly for more complex simulations. Consequently, the GUI provided for the simulation platform may significantly reduce the amount of data input required to execute a simulation, thus reducing the potential for input errors that cause rework. Furthermore, the use of a cloud environment or other network computing environment offers access to scalable high-performance computing resources that enable design teams to run large and more complex simulations. For instance, implementations herein may distribute simulators and workloads across a plurality of virtual machines to enhance the efficiency of system-level and vehicle-level simulations. Accordingly, due to the time savings provided by automated setup, and further due to the high-performance computing capabilities and the scalable resources of the network computing infrastructure, the simulation platform herein enables creation of high-fidelity, large-scale, complex system-level and vehicle-level co-simulations that are not possible with conventional systems.

In addition, the platform herein may provide virtual-hardware-in-the-loop simulation (vHILS) capabilities, in addition to hardware-in-the-loop simulation (HILS). For example, HILS may include connecting actual microcontroller hardware to a simulator that simulates the behavior of the system being tested. However, use of actual hardware may restrict the flexibility and usefulness of a simulation system. Accordingly, examples herein also enable the use of vHILS, which may include a simulation including a virtual microcontroller or other processor simulator and a model of a system being tested. The use of vHILS lets design engineers quickly test complex virtual system designs that may contain a large number of vECUs earlier in the design process than would be possible with HILS testing techniques. Such testing may significantly improve product quality, minimize design and product development rework, and may expedite time to market. Accordingly, the simulation platform herein may enable simulation and testing early in the development process.

The simulation platform herein enables a user to work with a large number of heterogeneous models at one time. The automated setup and simulation initiation capabilities provided by the GUI make large-scale, complex, mixed domain and physics co-simulation possible. For instance, the simulation platform may couple traditional model partitioning techniques with automatic allocation of high-performance network-based computing resources to reduce simulation execution time. Thus, users may conduct heterogeneous co-simulations that are larger and more complex than with conventional solutions. For example, design teams can add more models from more functional areas and organizations, e.g., engine, brakes, chassis, fuel, safety, and any other internal and external teams.

For discussion purposes, some example implementations are described in the environment of co-simulating multiple ECUs on network computing resources. However, implementations herein are not limited to the particular examples provided, and may be extended to other types of computing environments, other system architectures, other types of simulations, and so forth, as will be apparent to those of skill in the art in light of the disclosure herein.

FIG. 1 illustrates an example architecture of a system 100 for scalable simulation according to some implementations. In this example, network computing resources 102 may include a plurality of computing devices 104 and associated storage 106. As discussed additionally below, the plurality of computing devices 104 may include one or more servers or other types of computing devices that may be embodied in any number of ways. For instance, in the case of a server, applications, programs, modules, or other functional components, and at least a portion of data storage may be implemented on at least one server, such as in a cluster of servers, a server farm, or data center, a cloud-hosted computing service, and so forth, although other computer architectures may additionally or alternatively be used. Further, the storage 106 may include storage arrays, network attached storage, storage area networks, RAID storage systems, thin-provisioned storage systems, and so forth.

The network computing resources 102 may be configured to provide a simulation platform 108 that may include a plurality of virtual machines 110 that may be allocated from a resource pool 112 by a virtual machine resource manager 114. As discussed additionally below, the virtual machine resource manager 114 may allocate resources from the resource pool 112 for providing the simulation platform 108 for executing particular simulation jobs. As one example, a separate virtual machine may be allocated for each vECU to be included in a simulation.

In addition, a database manager 116 may access storage 118, which may include a database configured to store and provide information for the simulation platform 108. Examples of information maintained in the storage 118 and managed by the database manager 116 may include simulation models, user information, license information, simulation logs, simulation results, and the like. The network computing resources 102 may further include a web interface 120 that is able to communicate with one or more client computing devices 122, such as user devices, or the like, over one or more networks 124.

The one or more networks 124 may include any type of network, including a local area network (LAN), such as an intranet; a wide area network (WAN), such as the Internet; a wireless network, such as a cellular network, a local wireless network, such as Wi-Fi, and/or short-range wireless communications; a wired network including fiber optics, Ethernet, Fibre Channel, or any other such network, a direct wired connection, or any combination thereof. Accordingly, the one or more networks 124 may include both wired and/or wireless communication technologies. Components used for such communications can depend at least in part upon the type of network, the environment selected, or both. Protocols for communicating over such networks are well known and will not be discussed herein in detail. Accordingly, the client computing device(s) 122 and the management computing device(s) 132 are able to communicate over the one or more networks 124 with the network computing resources 102 using wired or wireless connections, and combinations thereof.

Further, a simulation manager 126 may manage the execution of simulations on the simulation platform. For example, the simulation manager 126 may ensure that the user has sufficient licenses for executing a specific simulation. Further, the simulation manager 126 may control timing of the execution of simulations. As one example, if a user is executing a first simulation and also submits for execution a second simulation, the simulation manager 126 may check whether the user has sufficient licenses available, and if not, may delay execution of the second simulation until a sufficient number of licenses are freed up following completion of execution of the first simulation.

In addition, a system manager 128, administrator, or the like, may use an application 130 on a management computing device 132 to send management inputs 134 to the web interface 120 for controlling various aspects of the simulation platform 108, such as for ensuring the proper operation of the simulation platform 108. In some examples, the application 130 may be a browser, while in other examples, the application 130 may be a proprietary application for controlling the configuration of the simulation platform 108.

In addition, a user 136 may be associated with a client computing device 122, and may use a browser 138 on the client computing device 122 for accessing the simulation platform 108 through the web interface 120. For example, the user 136 may log into the web interface 120, and may receive GUI information 140 such as webpages, executable scripts, or the like, that may be used by the browser 138 for presenting the GUI to the user 136. For instance, the user 136 may interact with the browser 138 to provide user inputs 142 to the web interface 120 such as for configuring a desired simulation for execution on the simulation platform 108. Furthermore, in some example, the user 136 may upload one or more models 144, which may be stored in the storage and/or database 118. Additionally, or alternatively, the user 136 may use one or more models already present in the storage and/or database 118, as discussed additionally below. Each of the virtual machine resource manager 114, the database manager 116, the web interface 120, and the simulation manager 126 may correspond to one or more computer programs, portions thereof, or other executable code that may be executed on one or more of the physical computing devices 104. In some examples, some or all of these computer programs may be executed on the same physical machine 104 and/or same virtual machine 110, while in other examples, some or all of these computer programs may be executed on separate physical machines, separate virtual machines, and so forth.

In some examples, the user 136 may use the GUI presented by the browser 138 to configure a desired simulation, which may include a plurality of simulators 148 such as processors simulators (vECUs), plant simulators, and/or other types of simulators. Each simulator may be configured to emulate a real-world component, such as for generating or receiving one or more signals that would be generated or received, respectively, by the real-world component.

As one example, in the case that one or more of the simulators 148 is a vECU, the vECU may be configured to emulate an actual ECU. ECU (Electronic Control Unit) is a generic term for any embedded system that controls one or more of the systems, subsystems or components in a vehicle. Depending on the software installed on an ECU and the intended purpose of the ECU, ECUs may be categorized into various different types, such as, Battery Management Unit (BMU), Body Control Module (BCM), Brake Control Module (BCM or EBCM), Central Control Module (CCM), Central Timing Module (CTM), Door control unit (DCU), Electronic/engine Control Module (ECM), General Electronic Module (GEM), Human-machine interface (HMI), Motor Control Unit (MCU), Power Steering Control Unit (PSCU), Powertrain Control Module (PCM), Seat Control Unit (STCU), Speed control unit (SCU), Suspension Control Module (SCM), Telematic control unit (TCU), Transmission Control Module (TCM), and various other types of control modules or control units. Together, these ECUs are sometimes referred to as the vehicle's computer; however, as noted above, there may be 50, 100, or more ECUs in a vehicle. Further, in some cases, one assembly may incorporate several individual ECUs. For example, the PCM may include ECUs for both the engine and the transmission.

Each ECU may include a processor, a memory, and digital and/or analog communication interfaces. Software for execution by a particular ECU may be stored to the memory associated with the respective ECU to enable the ECU to operate as an embedded system. ECUs may typically communicate with each other over a vehicle bus according to a vehicle bus protocol. As an example, the Controller Area Network bus (CAN bus) protocol is a vehicle bus protocol that allows ECUs and other devices to communicate with each other without a host computer. CAN bus may include at least two different types. For example, high-speed CAN may be used in applications where the bus runs from one end of the environment to the other, while fault-tolerant CAN is often used where groups of nodes are connected together.

In the simulations herein, a vECU may be a processor simulator that is executable by a computing device, such as a physical computing device, or a virtual machine executing on a physical computing device. Accordingly, as used herein, a vECU may include a processor simulator of any of the above-described types of ECUs, or any of various other vehicle control units, control modules, or the like. Further, since the vECU is a processor simulator that emulates the actual function of a real ECU processor, such as emulating a real ECU processor provided by a particular manufacturer, a user may provide software, such as control software that is intended to be installed on the real ECU, and may execute the control software on the vECU to determine whether the control software performs as intended. Further, as discussed below, implementations herein may provide a virtual CAN bus and virtual CAN router that enables multiple vECUs to be connected for communication with each other for emulating the communication between ECUs on a CAN bus in an actual vehicle. In addition, other types of simulators may be connected to vECUs and/or other types of simulators through other types of connections (e.g., a virtual signal bus), such as for providing emulated sensor inputs to simulate the systems (i.e., the "plant") to which the actual ECUs or other components would be connected in the real world.

In this example, suppose that the user has configured a plurality of simulators 148(1), . . . , 148(M) for a simulation. In response, the virtual machine resource manager 114 may allocate a plurality of virtual machines 110(1), . . . , 110(M) for executing the specified simulators 148 in the simulation platform 108. In some examples, a separate virtual machine 110 may be allocated for each simulator 148, while in other examples, multiple the simulators may be executed on the same virtual machine. In addition, the virtual machine resource manager 114 may allocate additional virtual machines . . . 110(N) for executing other simulators and/or a simulation data collector 150. For example, the simulation data collector 150 may manage the execution of the simulation, receive logs/reports of the progress of the simulation, and may send the results of the simulation to the database manager 116 for storing the results on the storage 118 and/or to the web interface 120 for sending the results to the client computing device 122.

The virtual machines 110 may be able to communicate with each other through a physical connection 152, which may be a local area network, such as Ethernet or fiber optic, or in the case of multiple virtual machines on the same physical machine may include an internal bus of a physical computing device. For instance, the virtual machines may communicate using TCP/IP or other suitable communication protocols. As discussed additionally below, in some examples, one of the simulators 148 may be a vECU configured to function as a CAN router for controlling communications between the simulators 148 along the connection 152. Accordingly, the CAN router may provide a virtual CAN bus between multiple simulators, such as multiple vECUs, by enabling communication between the virtual machines 110, and thereby enabling the creation of complex system-level and vehicle-level simulations including a plurality of vECUs and/or other simulators able to communicate with each other.

The simulation platform 108 of FIG. 1 may be configured to emulate vehicle components, vehicle systems, or entire vehicles. Based on the desired simulation additional virtual machines 110 may be allocated to the simulation platform 108 or deallocated back to the resource pool 112. Consequently, vehicle design teams or other users may use the simulation platform 108 to alleviate integrated-system-reliability concerns by testing levels of complexity, fidelity, and abstraction not previously possible. For instance, the simulation platform 108 may enable design teams to test and verify multiple high-fidelity virtual microcontroller ECUs concurrently, and reduce end-to-end simulation processing times by up to 80% compared to existing tools. In addition, the simulation platform 108 may enable initialization of large-scale complex co-simulations in a much shorter time than with current tools, may significantly reduce simulation-related overhead costs and capital expenditures, and may keep vitally important simulation model intellectual property safe and secure. With these simulation performance improvements, design engineering teams may dramatically accelerate time-to-market performance, improve product quality, and reduce costs.

The simulation platform 108 may make the routine testing of high-fidelity, large-scale, complex system-level and vehicle-level designs possible across a wide variety of domains, physics, and levels of abstraction, such as with multiple high-fidelity virtual microcontroller ECUs and a large variety of simulation tools. As discussed additionally below, the simulation platform 108 may provide automated simulation setup, initiation, monitoring, and reporting; simplified, time-efficient simulation processes accessible from anywhere on the secure web connection; easy-to-use, informative GUI; HPC cloud scalability, security, and flexibility; ability to test multiple high-fidelity virtual ECUs and other components; enhanced collaboration tools; and industry-tested security capabilities.

Figure 2:
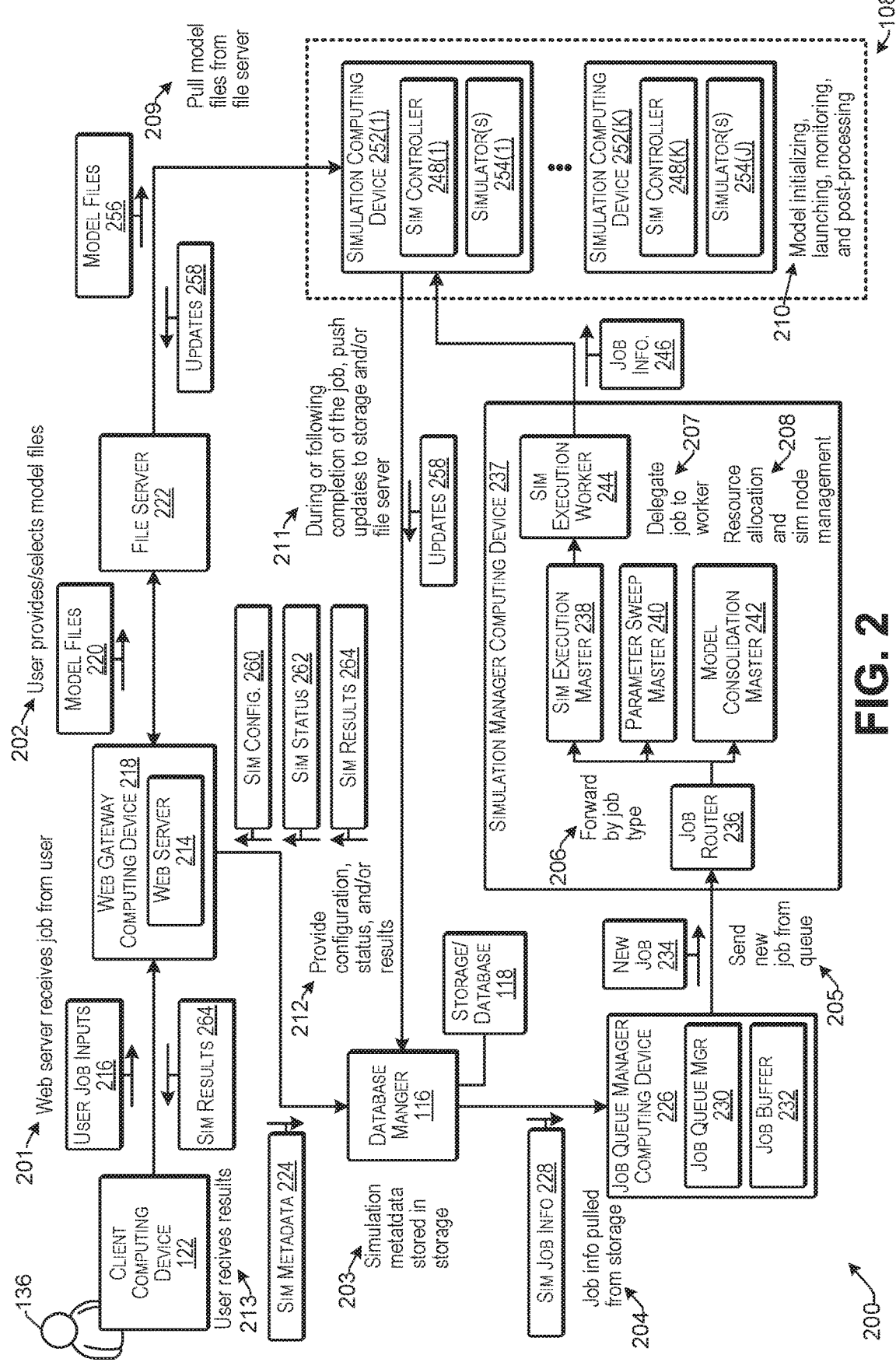
FIG. 2 illustrates a block diagram showing components and operations for performing a simulation according to some implementations.

FIG. 2 illustrates a block diagram 200 showing components and operations for performing a simulation according to some implementations. FIG. 2 includes a description of thirteen example operations 201-213 that may be included for executing a simulation job and providing results to the user 136. For example, the simulation job may be executed using the simulation platform 108 in the system 100 discussed above with respect to FIG. 1. Further, some or all of the operations may be implemented in hardware, software or a combination thereof. In the context of software, the operations may represent computer-executable instructions stored on one or more computer-readable media that, when executed by one or more processors, program the processors to perform the recited operations. Generally, computer-executable instructions include routines, programs, objects, components, data structures and the like that perform particular functions or implement particular data types. The order in which the operations are described should not be construed as a limitation. In some cases, the described operations may be combined in other orders and/or performed in parallel to implement the process, or alternative processes, and not all of the operations need be executed.

At 201, a web server 214 receives job information, such as user job inputs 216 from the client computing device 122 associated with the user 136. For instance, the web server 214 may execute on a web gateway computing device 218. The web server 214 may provide the web interface 120 discussed above with respect to FIG. 1, and the user 136 may use the web interface to configure a simulation job for execution by the simulation platform 108.

At 202, one or more model files 220 may be provided by the user or selected by the user and managed by a file server 222. In some examples, the file server 222 may be a storage controller that is associated with the storage and/or database 118. In other examples, the file server 222 may be software that operates on the web gateway computing device, or other computing device in the system 100 discussed above. As another alternative, the file server 222 and the database manager 116 may be part of the same functional component.

At 203, simulation metadata 224 may be stored in the storage and/or database 118. For example, the web server 214 may receive information about the simulation configuration as the user job inputs 216, and the database manager 116 may store the configuration information in the storage and/or database 118 as the simulation metadata 224. In some examples, the storage and/or database 118 may be any type of object storage, while in other examples, the storage and/or database 118 may include an actual database structure and components, such as a document-oriented database, or other type of database.

At 204, a job queue manager computing device 226 may obtain the simulation job information 228 from the storage 118, such as by requesting the job information 228 from the database manager 116. For example, the simulation job information 228 may include configuration details about the simulation job set up by the user 136, and may identify the model files 220 to be used in the simulation job. The job queue manager computing device may include a job queue manager program 230 that controls the job queue for the simulation platform 108 and may further include a job buffer 232 that serves as the job queue for the simulation platform 108.

At 205, the job queue manager 230 may send a new job 234 from the job buffer 232 to a job router 236 on a simulation manager computing device 237. As one example, the job queue manager 230 may send the new job 234 in response to receiving a request from the job router 236 for a next job in the job buffer 232.

At 206, the job router 236 may forward the new job 234 based at least partly on job type or parameters, and further based on available computing resources. For example, the new job 234 may be forwarded to at least one of a simulation execution master 238, a parameter sweep master 240, and/or a model consolidation master 242.

At 207, the simulation execution master 238 may delegate the job to a simulation execution worker 244. In some examples, the user may desire to perform a parameter sweep in which multiple parameter values are applied to one or more model parameters during the simulation. In such a case, the parameter sweep master 240 may determine the parameters associated with the new job prior to providing the new job to the simulation execution worker 244. Additionally, or alternatively, the model consolidation master 242 may consolidate one or more models identified by the simulation job 234, such as to reduce the number of models prior to execution during the simulation, such as for reducing the number of licenses required for executing the simulation.

At 208, the simulation execution worker 244 may allocate resources and may use job information 246 to set up one or more simulation controllers 248 that are executed by one or more simulation computing devices 252, respectively, for controlling the simulation job on each simulation computing device 252. For example, the simulation execution worker 244 may allocate a plurality of simulation computing devices 252(1)-252(K) to execute simulators 254(1)-254(J) for the simulation job. Each simulator 254 may include or may access one or more model files. There may be a simulation controller 248(1)-248(K) provided on each simulation computing device 252(1)-252(K). Further, there may be one or more simulators 254(1)-254(J) per simulation computing device 252(1)-252(K). Furthermore, as mentioned above some or all of the simulation computing devices 252 and/or the simulation manager computing device 237 and/or the job queue manager computing device 226 and/or the web gateway computing device 218 and/or the file server 222 may be virtual machines, or alternatively, some or all of these computing devices may be separate physical machines.

At 209, the simulation controllers 248(1)-248(K) may pull model files 256 from the file server 222. For example, the simulation controller 248(1)-248(K) may request the model files 256 identified in the job information 246 as being assigned to the current simulation job for the respective simulators 254 controlled by that simulation controller.

At 210, each simulation controller 248 may initialize the models/simulators, launch the simulation, monitor the simulation during execution of the simulation, and perform post-processing following completion of the simulation. The simulation execution worker 244 may coordinate the operation of the respective simulation controllers 248(1)-248(K), such as for instructing the initializing and launching of the simulation. Thus, the simulation execution worker 244 may manage the execution of the simulation across all participating simulation computing devices 252(1)-252(K).

At 211, during or following completion of the simulation job, the simulation controllers 248 and/or the simulation execution worker 244 may push updates 258 to the database manager 116 and storage 118 and/or to the file server 222. For instance, the simulation status or results may be stored in the storage and/or database 118. As mentioned above, in some instances the file server 222 may serve as a controller for the storage/database 118 in addition to, or as part of the database manager 116.

At 212, the web server 214 may provide simulation configuration information 260, simulation status information 262, and/or simulation results 264 to the client computing device 122, such as based on the updates 258.

At 213, the user 136 may receive the simulation results 264 at the client computing device 122. In some cases, the results may be in the form of a graph or other human-readable information. For example, the web server 214 may send the simulation results 264 and/or the simulation status information 262 and/or the simulation configuration information 260 to the client computing device 122. Furthermore, while the foregoing description sets forth one example of operations performed for executing a simulation job on the simulation platform 108, numerous other possible variations will be apparent to those of skill in the art having the benefit of the disclosure herein.

Figure 3:
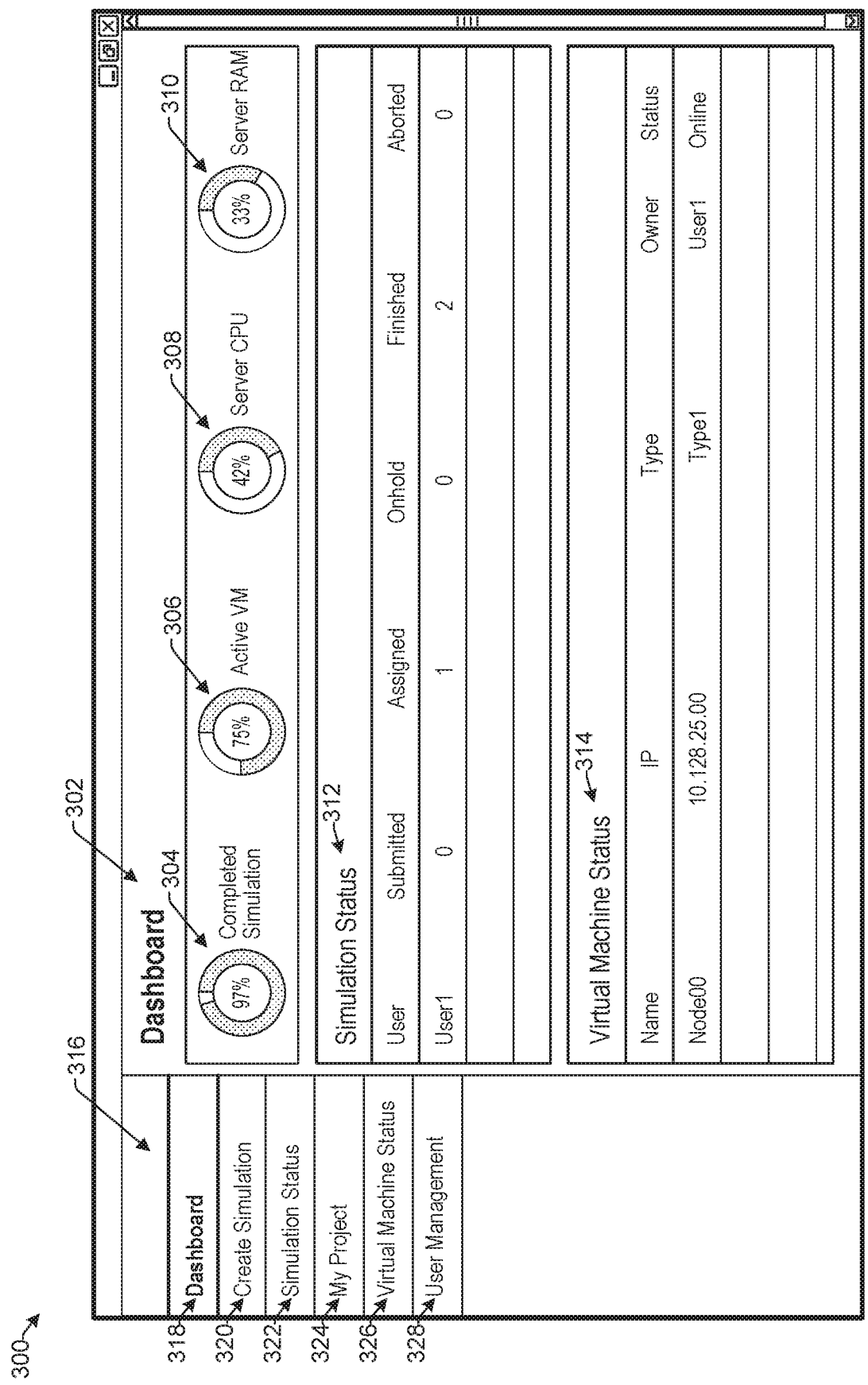
FIG. 3 illustrates an example GUI for creating a simulation job according to some implementations.

FIG. 3 illustrates an example GUI 300 for creating a simulation job according to some implementations. In this example, the GUI 300 illustrates a dashboard 302 that may be presented to a user by the web interface to enable the user to determine the status of any existing or previously submitted simulation jobs. For example, the dashboard 302 may indicate the status of current or completed simulations 304, active virtual machines 306, server CPU 308, and/or server RAM 310. In addition, the dashboard 302 may provide more detailed information about certain parameters such as simulation status 312 and/or virtual machine status 314. In this example, the dashboard indicates that the current simulation is 97% complete, that the percentage of active virtual machines is 75% of the available virtual machines, the percentage of servers CPU used is 42%, and the percentage of server RAM used is 33%.

In addition, as indicated at 316 a plurality of virtual controls may be provided for presenting different portions of the GUI 300 to the user. For instance, in this example a dashboard virtual control 318 is highlighted to indicate that the dashboard 302 has been selected for display. The virtual controls 316 may further include a control 320 for creating a new simulation, a control 322 for determining a simulation status, a control 324 for accessing a current project, a control 326 for determining virtual machine status, and a control 328 for performing user management. As one example, suppose that the user does desires to create a new simulation. Accordingly, the user may click on or otherwise select the create simulation virtual control 320, in response, and may be presented with a GUI discussed below with respect to FIG. 4.

Figure 4:
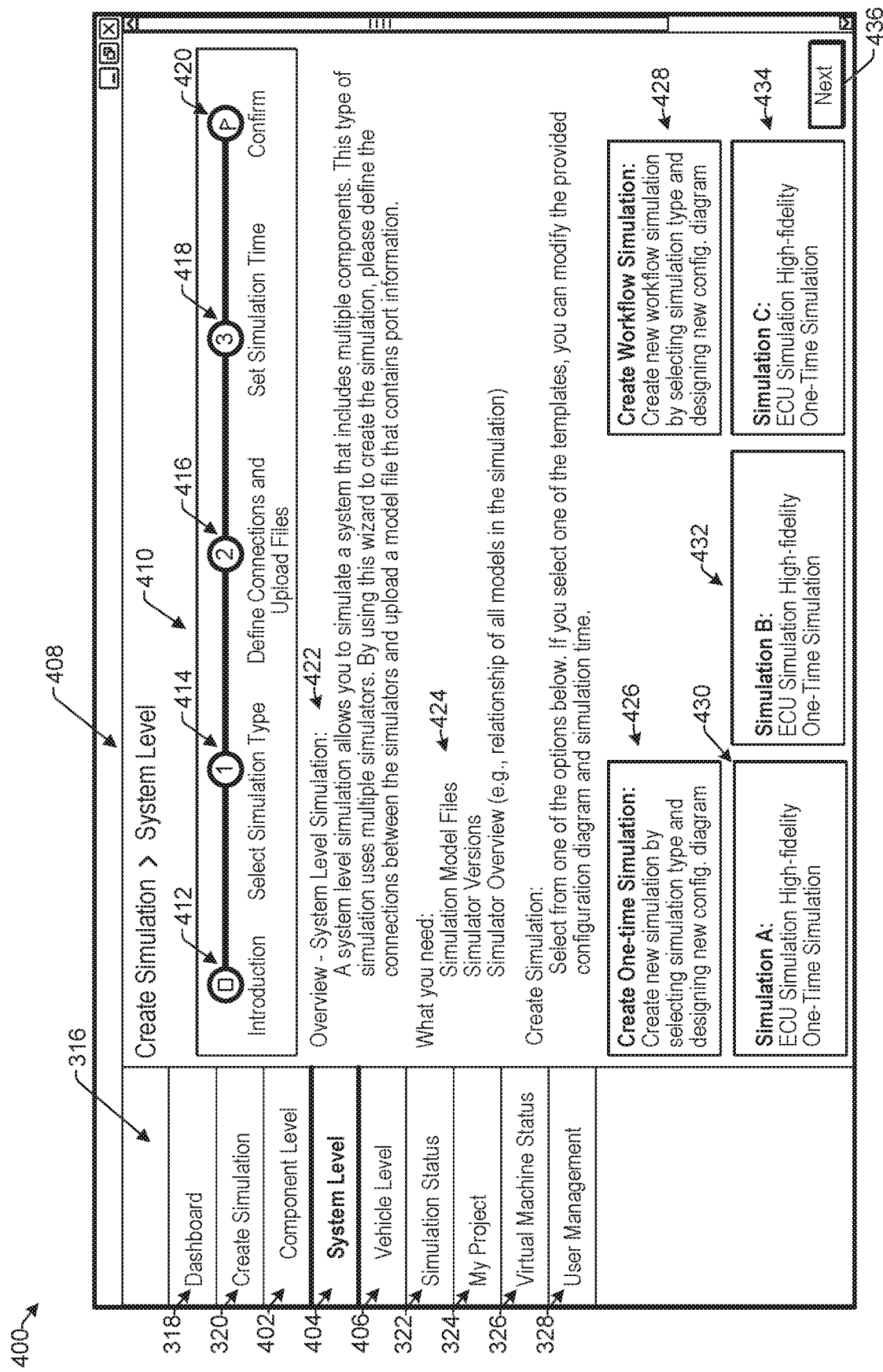
FIG. 4 illustrates an example GUI that may be presented for creating a new simulation according to some implementations.

FIG. 4 illustrates an example GUI 400 that may be presented for creating a new simulation according to some implementations. As mentioned above, suppose that the user has selected the virtual control 320 for creating a simulation. In response, the GUI 400 may present three additional virtual controls, namely, a component level virtual control 402 for selecting creation of a component level simulation, a system level virtual control 404 for selecting a system level simulation, and a vehicle level virtual control 406 for selecting a vehicle level simulation. For example, a component level simulation may use one or more simulators for emulating the behavior of a particular component of a vehicle; a system level simulation may use multiple simulators to simulate a system that includes multiple components; and a vehicle level simulation may use a plurality of simulators to simulate a number of different components and/or systems that may be included in a vehicle. For each of these three selections, different options may be presented when selected by the user for creating different types of simulations. In this example, suppose that the user has selected the system level virtual control 404 for creating a system level simulation. As a result, as indicated at 408, the GUI 400 may indicate that the simulation being created is a system level simulation.

Furthermore, the GUI 400 may include a simulation creation progress chart 410 to help guide the user through the creation of the simulation. In this example, the progress chart 410 includes an introduction stage 412, a "select simulation type" stage 414, a "define the connections and upload the files" stage 416, a "set simulation time" stage 418, and a "confirm the simulation" stage 420, each of which are discussed below.

Initially, as illustrated in FIG. 4, during the introduction stage 412, the GUI 400 may present an introduction page that describes an overview 422 for creating a system level simulation, and that further describes at 424 the requirements for a system level simulation. In addition, the GUI 400 may include a plurality of selectable options for creating the system so level simulation such as an option 426 for creating a one-time simulation, option 428 for creating workflow simulation, an option 430 for creating a first type of ECU simulation, an option 432 for creating a second type of ECU simulation, and an option 434 for creating a third type of ECU simulation. For example, a workflow simulation may include consecutive simulations in which a later simulation receives an output of an earlier simulation. In addition, the user may scroll down to select other options not shown in this example. When the user has selected a desired option, the user may select a next button 436 to advance to the next stage for further selecting the simulation type.

Figure 5:
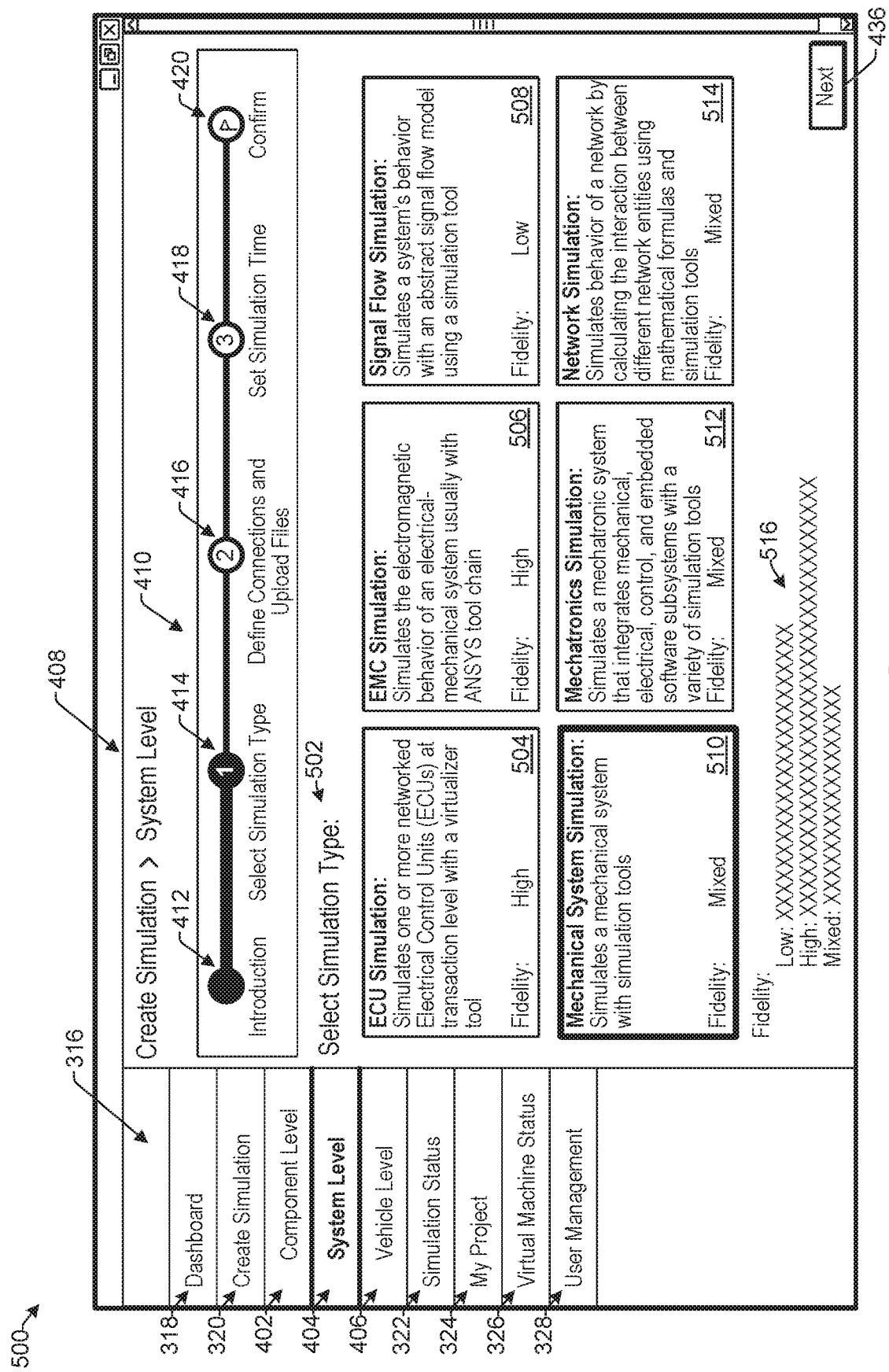
FIG. 5 illustrates an example GUI that may be presented for selecting a simulation application type according to some implementations.

FIG. 5 illustrates an example GUI 500 that may be presented for selecting a simulation application type according to some implementations. Suppose that in the GUI 400 of FIG. 4, the user has selected an option to create a one-time simulation, and has subsequently advanced to the GUI 500 to select the simulation type, as indicated by the highlighted stage 414 in the progress chart 410. As indicated at 502, the GUI 500 may present a plurality of options for selecting a simulation type. Examples of simulations the may be selected in this example include an ECU simulation 504, and electromagnetic compatibility (EMC) simulation 506, a signal flow simulation 508, a mechanical system simulation 510, a mechatronics simulation 512, and a network simulation 514. Furthermore, while several example common simulation use-cases are illustrated in this example, other types of simulations that may be included in other examples will be apparent to those of skill in the art having the benefit of the disclosure herein. Further, the user may manually add more simulators to a selected simulation configuration, such as using drag-and-drop of additional simulators, which may be selected, e.g., from a simulator library, or the like.

In addition, each simulation type 502 may indicate an associated fidelity of the simulation type. For example, the fidelity of a simulation may indicate the degree to which a model or simulation reproduces the state and behavior of a real world component, system, or process. Accordingly, fidelity may be considered an indication of the realism of a particular model or simulation. For instance, suppose that the user clicks on or otherwise selects mechanical system simulation 510. As indicated at 516, the GUI 500 may present information about the fidelity of the selected mechanical system simulation 510, which shows that the fidelity is mixed in this example. When the user has selected a desired simulation type, the user may select the next button 436 to advance to the next stage.

Figure 6:
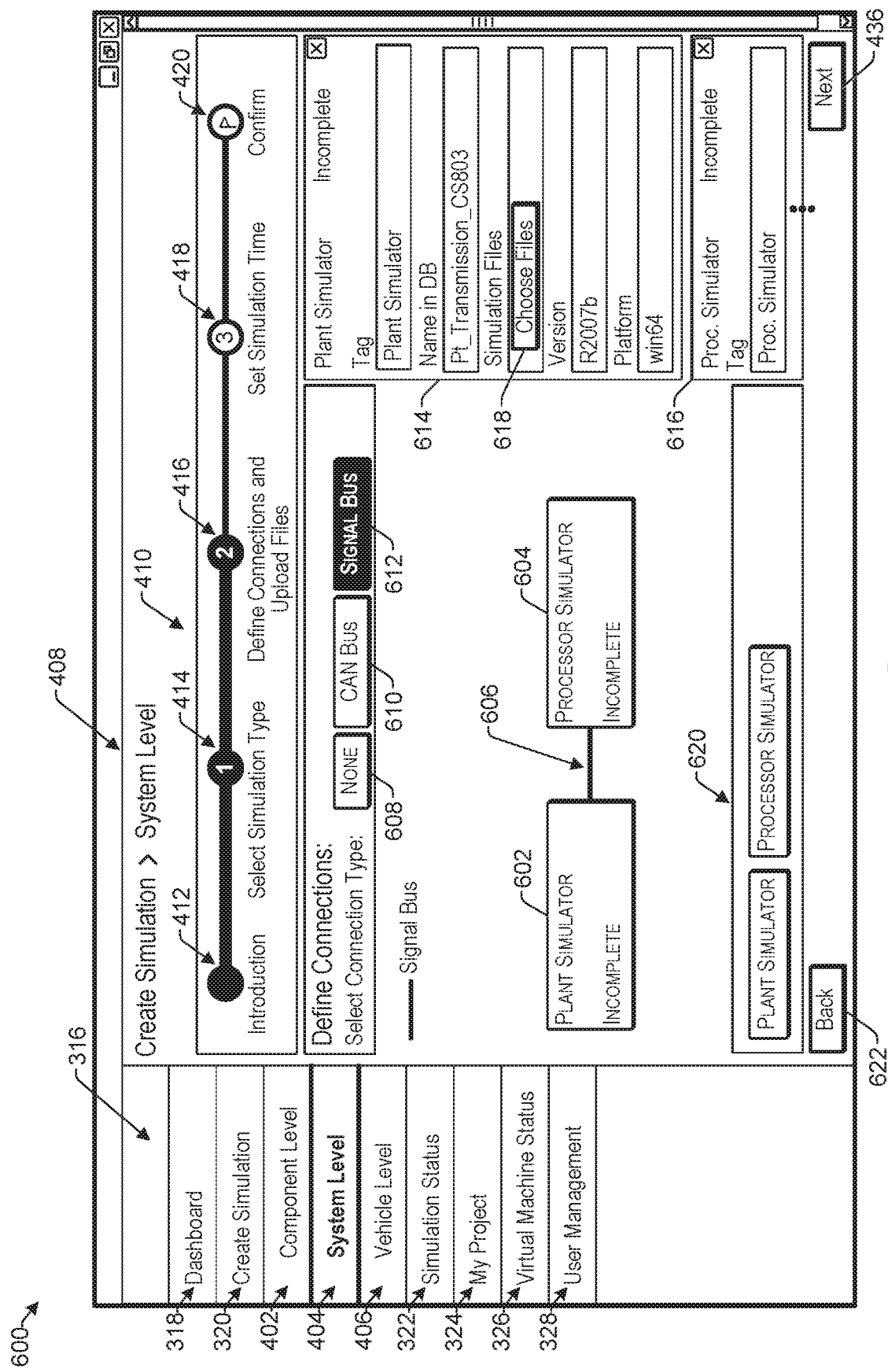
FIG. 6 illustrates an example GUI that may be presented for selecting models and defining simulation connections according to some implementations.

FIG. 6 illustrates an example GUI 600 that may be presented for selecting models and defining simulation connections according to some implementations. Suppose that in the GUI 500 of FIG. 5, the user has selected the mechanical system simulation 510 as a simulation application type, and has subsequently advanced to the GUI 600 to define connections, select models, and upload files, as indicated by the highlighted stage 416 in the progress chart 410. As indicated at 602, the GUI 600 may enable the user to configure the simulation. In this example, two simulator representations 602 and 604 have been added. In some cases, the simulator representations 602 and 604 may be added by default based on the selected simulation application, while in other cases, the user may access a library to add one or more simulators. For instance, a first simulator 602 may be named "Plant Simulator" and a second simulator 604 may be named "Processor Simulator" or any other name selected by the user. Thus, the first simulator 602 may be configured as a virtual "plant", i.e., a component or system that is being controlled by an ECU, and the second simulator 604 may be configured as a processor simulator, i.e., a vECU that controls the plant.

The simulators 602 and 604 may be connected by a connection 606 that corresponds to a simulation of the real world connection. For example, similar to actual vehicle components and systems, some types of simulators may not be connected, some simulators may be connected by a CAN bus, some by a signal bus, and some by other types of connections. In some examples, based on the selected simulation application, the type of connections available may be limited to those that are possible in the real world. For instance, in this example, the selections are limited to none 608, CAN bus 610, and signal bus 612. In this example, suppose that the user has selected signal bus 612 as being appropriate for the connection in this simulation.

As one example, suppose that the simulator 602 will be used to simulate a transmission (i.e., a mechanical system), and simulator 604 may be a vECU configured to simulate a transmission control unit (TCU) ECU. For instance, the real-world transmission may include one or more sensors that send signals to the real-world TCU on a signal bus, rather than on a CAN bus. Therefore, for the current simulation, a virtual signal bus 612 is selected as the connection type between the simulator 602 and the simulator 604. On the other hand, if the user decides to add another vECU to this simulation, the user may connect the simulator 604 to the added vECU using a virtual CAN bus 610 as the selected connection. In some examples, the GUI 600 may prompt the user regarding which connection type to select based on the simulator selections.

In addition, at this point, the simulators are marked as incomplete, which may indicate that the user has not yet provided or selected model files to use for each simulator 602, 604 represented in the GUI 600. An information box may be presented in the GUI 600 for each simulator representation 602, 604. Thus, a first information box 614 may be presented for the first model 602 and a second information box 616 may be presented for the second model 604. Each information box may include a selectable control 618 that may be selected by the user to enable the user to browse and choose one or more model files to be used for the corresponding simulator. In addition, the GUI 600 may include a summary area 620 showing all the simulators that have been selected for a particular simulation, and may further include a back button 622 in case the user desires to go back to a previous interface, such as for changing a prior selection.

Figure 7:
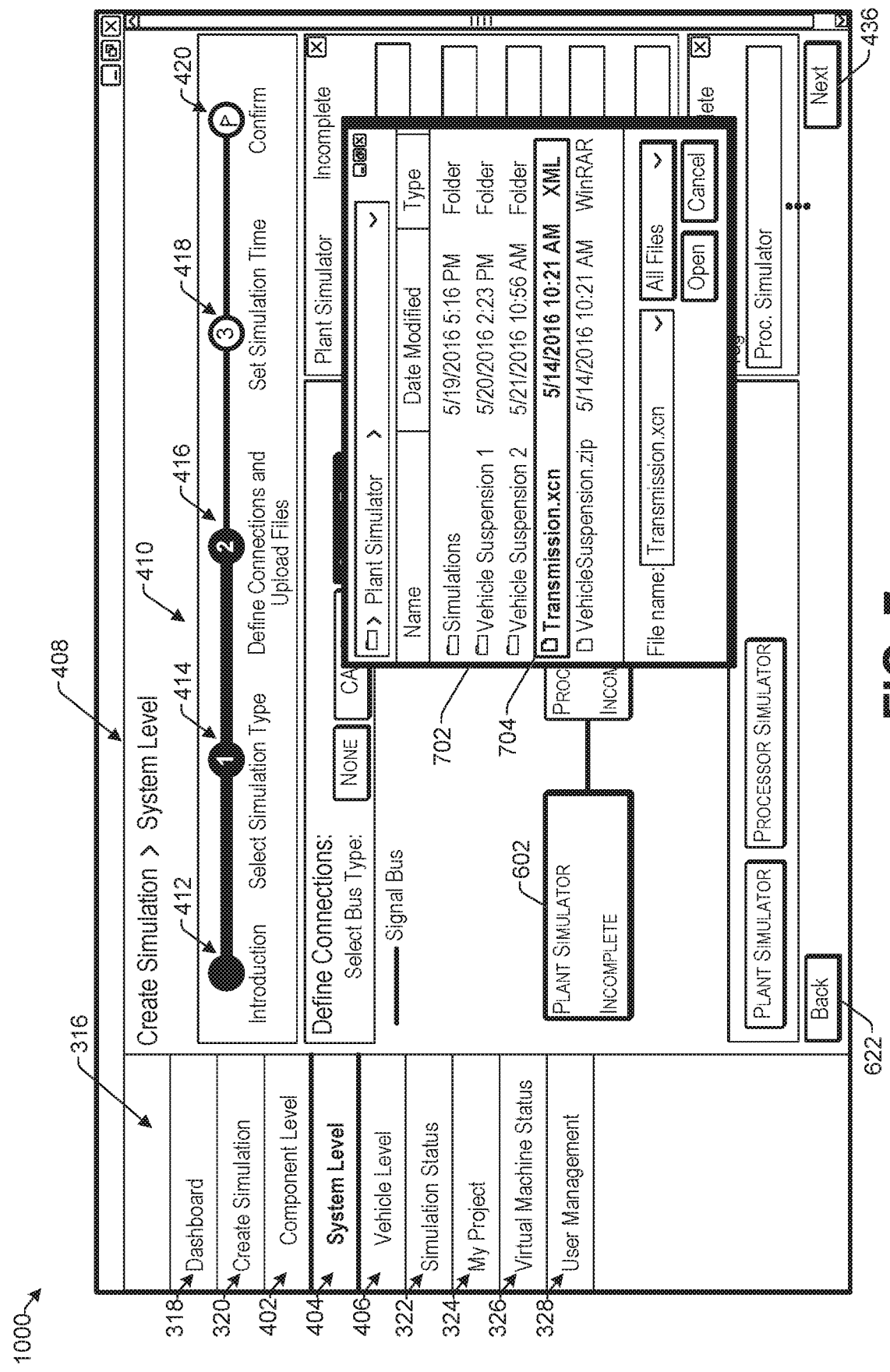
FIG. 7 illustrates an example of the GUI of FIG. 6 that may be presented for selecting model files according to some implementations.

FIG. 7 illustrates an example of the GUI 600 of FIG. 6 that may be presented for selecting model files according to some implementations. In this example, suppose that the user has selected the selectable control 618 discussed above for selecting one or more model files to add to the first simulator 602. In response, a pop-up window 702, or the like, may be presented to the user in the GUI 600. The user may use the pop-up window 702 to browse or otherwise locate one or more model files that may be added to the simulator 602. In this example, suppose that the user has selected a model file 704 entitled "Transmission.xcn". The user may select the model file 704 and click "open" to add the selected model file to the simulator 602. In some examples, the model files may be uploaded from the user's computing device, while in other examples, the user may select model files already uploaded and stored in a storage area or database associated with the simulation platform discussed above. The user may repeat this process for adding multiple model files to the simulator 602.

Figure 8:
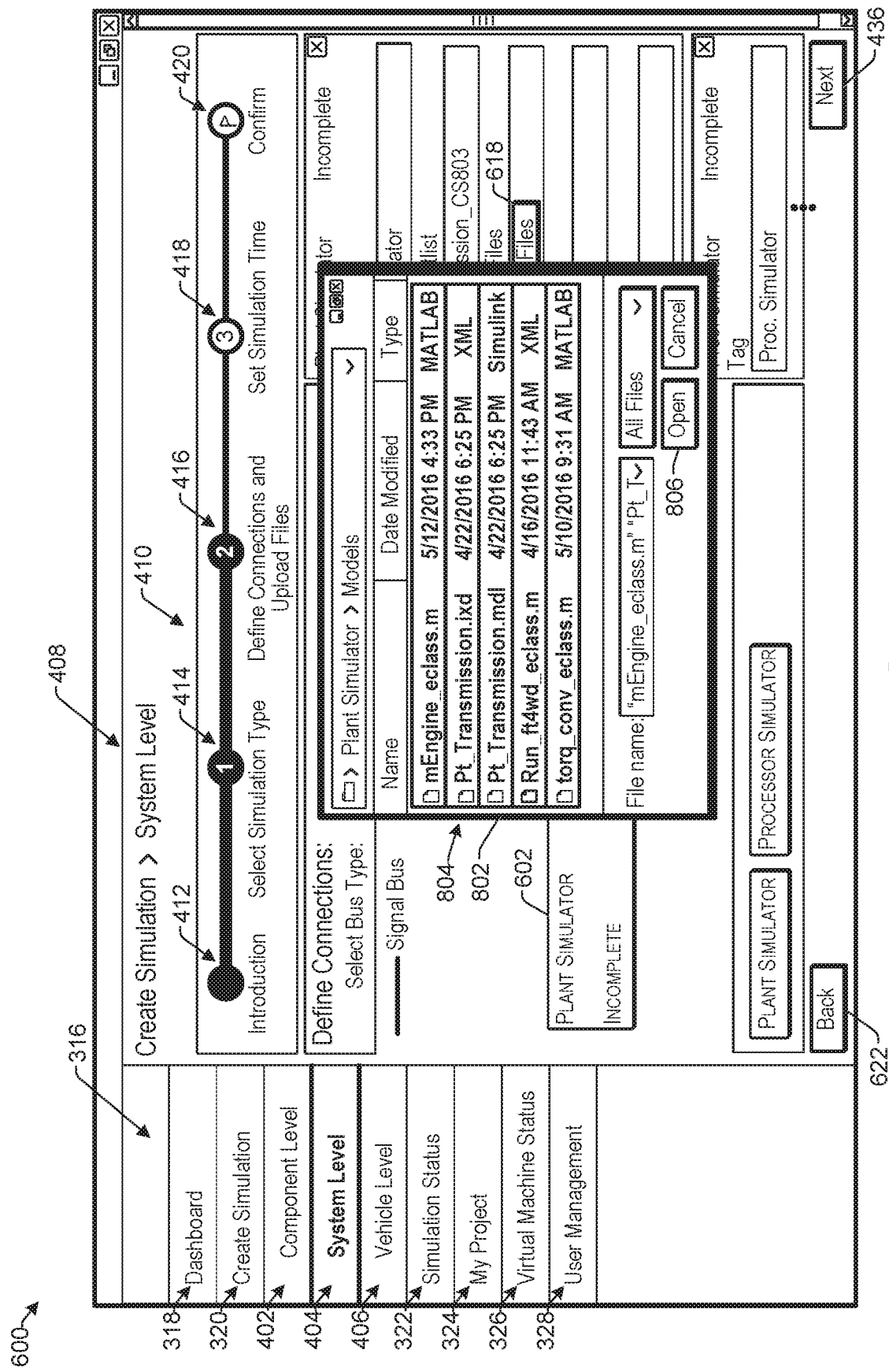
FIG. 8 illustrates an example of the GUI of FIG. 6 that may be presented for selecting model files according to some implementations.

FIG. 8 illustrates an example of the GUI 600 of FIG. 6 that may be presented for selecting model files according to some implementations. In this example, suppose that the user has selected the selectable control 618 for selecting one or more model files to add to the first simulator 602. In response, a pop-up window 802, or the like, may be presented to the user in the GUI 600. The user may use the pop-up window 802 to browse or otherwise locate one or more model files that may be added to the simulator 602. In this example, suppose that the user has selected a five model files 804 entitled "mEngine_eclass.m", "Pt_Transmission-.ixd", "PT_Transmission.mdl", "Run_ft4wd_eclass.m", and "torq_conv_eclass.M". In this example, the user may add all the selected model files to the simulator 602 by selecting "open" at 806. The user may similarly add one or more model files to the second simulator 604. When one or more model files have been added to simulators 602, 604, the "incomplete" designation may be removed.

Figure 9:
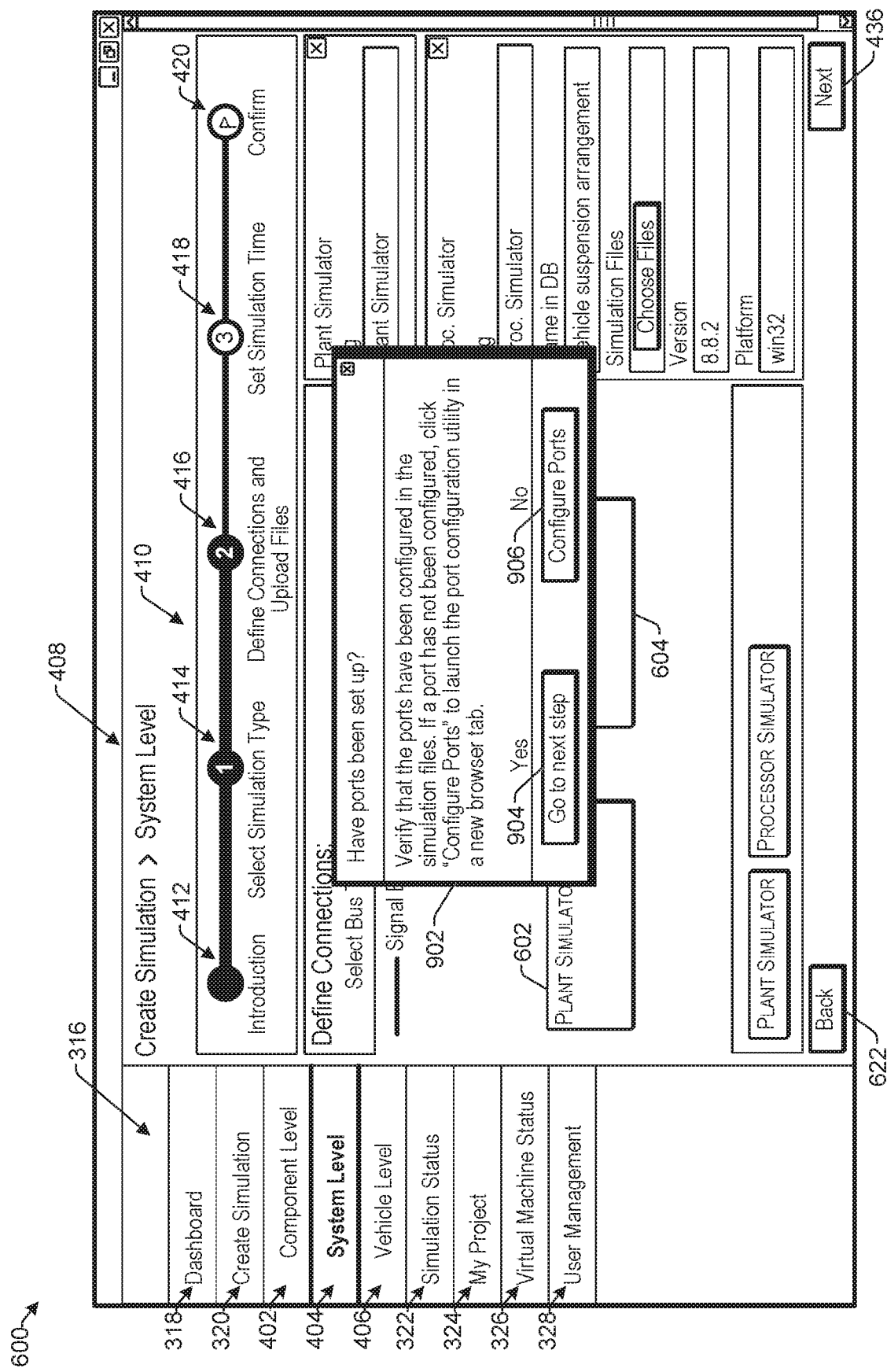
FIG. 9 illustrates an example of the GUI of FIG. 6 that may be presented for verifying port configurations according to some implementations.

FIG. 9 illustrates an example of the GUI 600 of FIG. 6 that may be presented for verifying port configurations according to some implementations. As one example, suppose that following selection of the model files for the first simulator 602 and the second simulator 604, the users selects the next button 436. In response, the system may determine whether the ports have been configured for the simulators 602 and 604. For instance, when a virtual CAN bus is used in the simulation, the ports may be configured by being defined with a direction and a data type. Accordingly, if a virtual CAN bus is used and the ports have not been configured, the system may present a pop-up window 902 with a prompt for the user to configure the ports for the simulators 602 and 604. If the user has already configured the ports, the user may select a virtual control 904 go to the next step; on the other hand, if the user has not configured the ports, the user may select a "configure ports" virtual control 906 to launch a port configuration utility, such as in a new browser tab. For instance, as discussed additionally below, for simulations that include multiple vECUs, a virtual CAN bus may be configured and may use TCP/IP protocol, or the like, to enable communications between the multiple vECUs. When the user has completed configuring the ports, the user may proceed to the next stage of the simulation creation.

Figure 10:
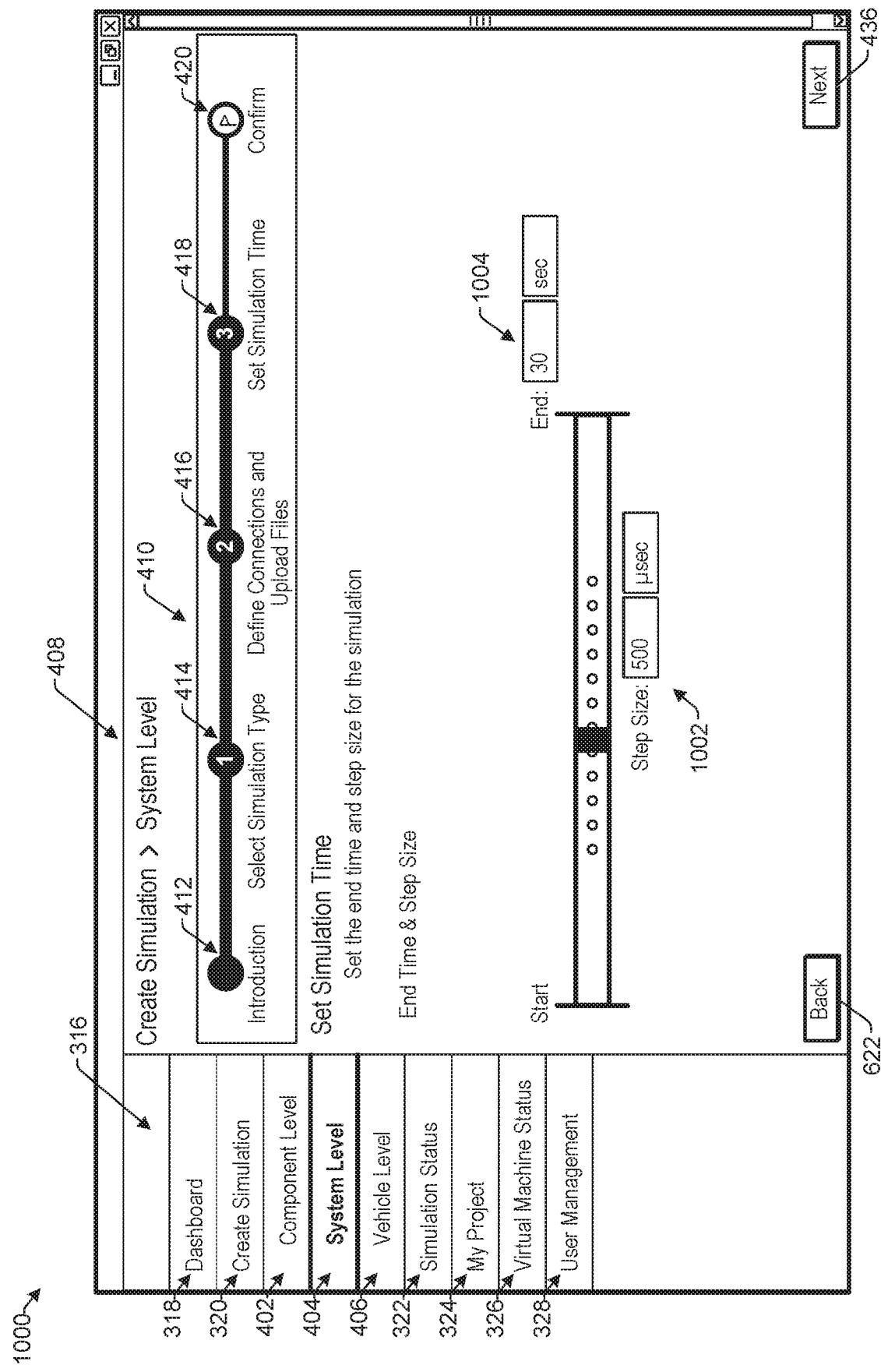
FIG. 10 illustrates an example GUI that may be presented for setting the simulation time according to some implementations.

FIG. 10 illustrates an example GUI 1000 that may be presented for setting the simulation time according to some implementations. After the user has finished defining the connections and uploading the model files, the user may advance to the next stage, as indicated at 418, for setting simulation time, and may be presented with the GUI 1000. As indicated at 1002, the user may set the step size for the simulation e.g., in number of microseconds or other selectable units. Furthermore, the user may select an end time for the simulation, which may control the overall time during which the simulation is conducted. In this example, the user has selected in time of 30 seconds, as indicated at 1004, although other units of time may be used for other types of simulations. Typically, the end time 1004 may not conform to the execution time for the simulation. For example, a 30 second end time 1004 may correspond to a substantially longer simulation execution time, e.g., minutes, hours, or longer.

In some examples, a dynamic system may be simulated by computing the states of the system at successive time steps over a specified time span. Accordingly, the step size 1002 indicates how often the states should be computed, while the end time 1004 specifies the time span for computing the states of the system. Generally, the smaller the step size, the more accurate the simulation but the trade-off is that simulations with smaller steps sizes consume more computing time and/or more computing resources. Furthermore, while a fixed step size is illustrated in this example, in other examples, the user may set a variable step size for some types of simulations. When the user has completed setting the step size and the end time, the user may select the next button 436 to proceed to the next stage.

Figure 11:
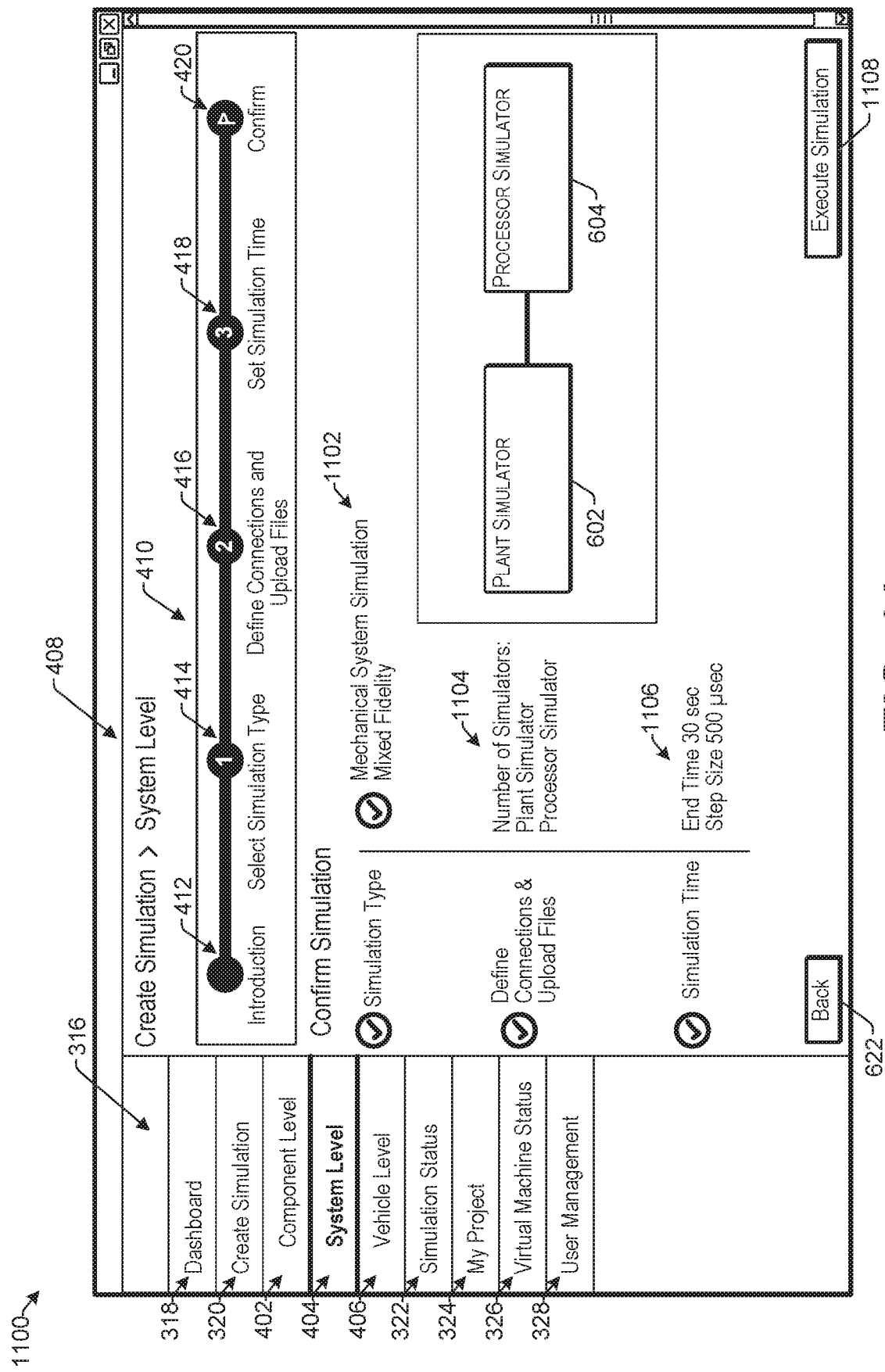
FIG. 11 illustrates an example GUI that may be presented for confirming the simulation according to some implementations.

FIG. 11 illustrates an example GUI 1100 that may be presented for confirming the simulation according to some implementations. After the user has finished setting the simulation end time and step time, the user may advance to the next stage, as indicated at 420, for confirming the simulation and submitting the simulation for execution. The user may be presented with the GUI 1100, which may provide the user with the opportunity to check and confirm that the simulation is configured as the user intends. For example, the user may confirm that the configured simulation is a mechanical system simulation of mixed fidelity, as indicated at 1102, that there are two simulators configured, as indicated at 1104, and that simulation is set for a specified end time and step size, as indicated at 1106. When the user has confirmed that the simulation is properly configured, the user may select an "execute simulation" virtual control 1108. On the other hand, if the user desires to make changes, the user may select the back button 622. In addition, in some cases the user may provide, or may have already provided parameter sweep information to enable a simulation that automatically progresses through a plurality of parameters such as in an incremental fashion. The user may provide parameter sweep information, as discussed additionally below with respect to FIGS. 23-24, and the simulation platform may be configured to execute the simulation with the indicated parameters.

Figure 12:
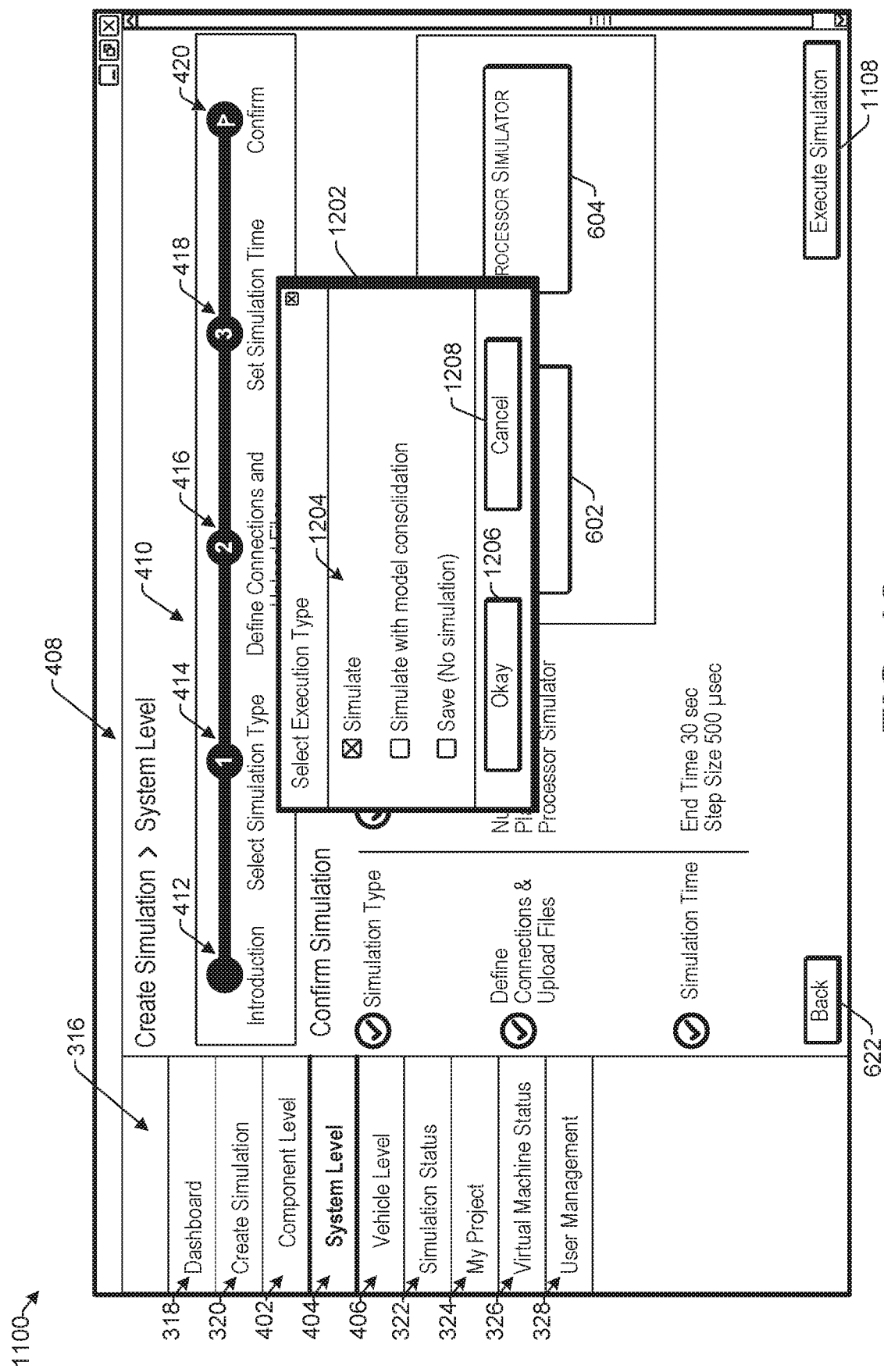
FIG. 12 illustrates an example of the GUI of FIG. 11 that may be presented for selecting model files according to some implementations.

FIG. 12 illustrates an example of the GUI 1100 of FIG. 11 that may be presented for selecting model files according to some implementations. In this example, suppose that the user has selected the execute simulation control 1108 for executing the simulation. In some examples, a pop-up window 1202, or the like, may be presented to the user in the GUI 1100. The user may use the pop-up window 1202 to select an execution type 1204, such as "simulate", "simulate with model consolidation" or "save (no simulation)". For instance, if the user selects "simulate with model consolidation", the simulation platform may attempt to consolidate models that are able to be consolidated, such as for minimizing license requirements for executing the simulation. When the user has made a selection from the execution types 1204, the user may select an okay button 1206 to submit the simulation for execution. On the other hand, if the user decides not to execute, or to revise the simulation, the user may select a cancel button 1208.

The foregoing drawings and description provide a tool for setting up and connecting simulators that may automatically populate all simulators in a simulation with one global entry for the simulation end time and the simulation step size. For example, a user may only have to define the simulation times one time using the presented GUI, and the system may automatically and globally populates the timing data to all simulators being used in the simulation. Accordingly, the users, such as design engineers, do not have to open each simulator to manually enter data into each simulation tool, which creates significant time savings, particularly as the number of simulators used in a simulation increases.

Furthermore, the GUI may be used to create and save simulation templates that can be reused by the original template creator or shared with team members to improve overall team productivity. For example, pre-populated templates that may be used in the GUI herein provide an efficient technique for setting up a simulation and are useful for setting up high-fidelity large-scale simulations that may be used for testing complex automotive designs. Additionally, some examples provide users with an option to consolidate models prior to initiating a simulation. For example, by consolidating multiple models into one model, the simulation may use fewer software licenses to run large simulations. While such consolidation may lengthen the time to complete a simulation, the use of the network computing resources herein may mitigate much of the performance loss. In addition, implementations herein may automatically performs a thorough check on all input data and files before a simulation is started, thus saving time, licenses, and computing power from being applied to simulations that are likely to fail.

Furthermore, rather than having to separately open each simulator and manually activate each tool, the GUI herein automates that entire process, enabling a user to initiate a co-simulations with a single input, regardless of complexity.

In addition, the raw data and graphical test results from all simulators used in a co-simulation may be consolidated in one place. Any redundant data and charts produced by multiple simulators may be excluded. This automated and streamlined output approach may simplify the sorting and visualization of data to enable a user to determine easily design insights. The results may be downloaded for additional analysis. In addition, because the simulation platform is web-based, the simulation platform may be accessed by a user from any convenient location.

The simulation platform and GUI herein may provide a streamlined simulation configuration process that includes dragging and dropping simulators into the simulation workspace; connecting simulators to define simulation relationships between tools; selecting the connection types between the simulators; uploading simulation design configurations; load simulation models; setting a global simulation time and step size; and initiating the simulation with a single keystroke or other user input. The GUI herein simplifies the simulation process, guides users with straight-forward instructions, enables drag-and-drop functionality, and provides a visual indicator of where the user is in the configuration process. Users are able to track progress by viewing their simulations in a queue and monitoring completion percentages once initiated. In addition, users may review consolidated logs and results, and may initiate parameter sweeps and re-runs.

The simulation platform herein is able to scale on the fly to provide essentially unlimited computing resources able to accommodate complex co-simulations. Users may use existing simulator software licenses or may pay for licenses through the simulation platform. Additionally, if a user's licenses are in use by other designers/simulations associated with the user, then the user may schedule a simulation job to run later after the other job is completed and the licenses become available.

In addition, the simulation platform herein enables testing of multiple high-fidelity virtual ECUs, and can be used to verify multiple high-fidelity microcontroller model-based virtual ECUs at one time. In some examples, a virtual HILS (vHILS) environment may be created that not only enables more complex simulations, but also lets the design team test large-scale system configurations earlier in the development process, i.e., before physical prototyping. Accordingly, a user may test high-fidelity, complex systems during the architecture and design stages of the vehicle development process and may avoid costly rework before prototyping ever begins. In addition, the vHILS capabilities may also enable users to significantly reduce the time needed to conduct the measurement and analysis phase of a simulation. For example, unlike a HILS approach that requires extensive manual effort using oscilloscopes, multimeters, and other measurement devices, the vHILS approach provided herein includes virtual measurement and analysis devices (e.g., scopes, displays, etc.) that may automatically generate insights as part of the simulation process, which may significantly reduce time, effort, and risk of errors, even as the number of ECUs in the simulation is increased.

The simulation platform herein provides a standard format and approach for conducting large-scale co-simulations, which builds consistency, enhances collaboration, and improves the quality of simulation results. For instance, multiple related users, such as a design team, may use the simulation platform to collaborate for creating an integrated simulation across different groups of engineers, including electrical, mechanical, embedded computational, electromagnetic, and/or NVH (noise, vibration, harshness)

domains; engine, brakes, fuel components, chassis, and/or powertrains; design, production, and/or manufacturing functions; OEM (original equipment manufacturer), tier one suppliers, and/or tier two suppliers. Further, users may invite colleagues from their own team, and/or from supplier teams or customer teams to participate in a simulation. The simulation platform enables shared setup, workflow, and results across domains. Additionally, users may create a library of simulation templates and models that can be used by the users and their colleagues.

FIGS. 13, 21, 24, 26, and 27 are flow diagrams illustrating example processes according to some implementations. The processes are illustrated as collections of blocks in logical flow diagrams, which represent a sequence of operations, some or all of which may be implemented in hardware, software or a combination thereof. In the context of software, the blocks may represent computer-executable instructions stored on one or more computer-readable media that, when executed by one or more processors, program the processors to perform the recited operations. Generally, computer-executable instructions include routines, programs, objects, components, data structures and the like that perform particular functions or implement particular data types. The order in which the blocks are described should not be construed as a limitation. Any number of the described blocks can be combined in any order and/or in parallel to implement the process, or alternative processes, and not all of the blocks need be executed. For discussion purposes, the processes are described with reference to the environments, frameworks and systems described in the examples herein, although the processes may be implemented in a wide variety of other environments, frameworks and systems.

Figure 13:
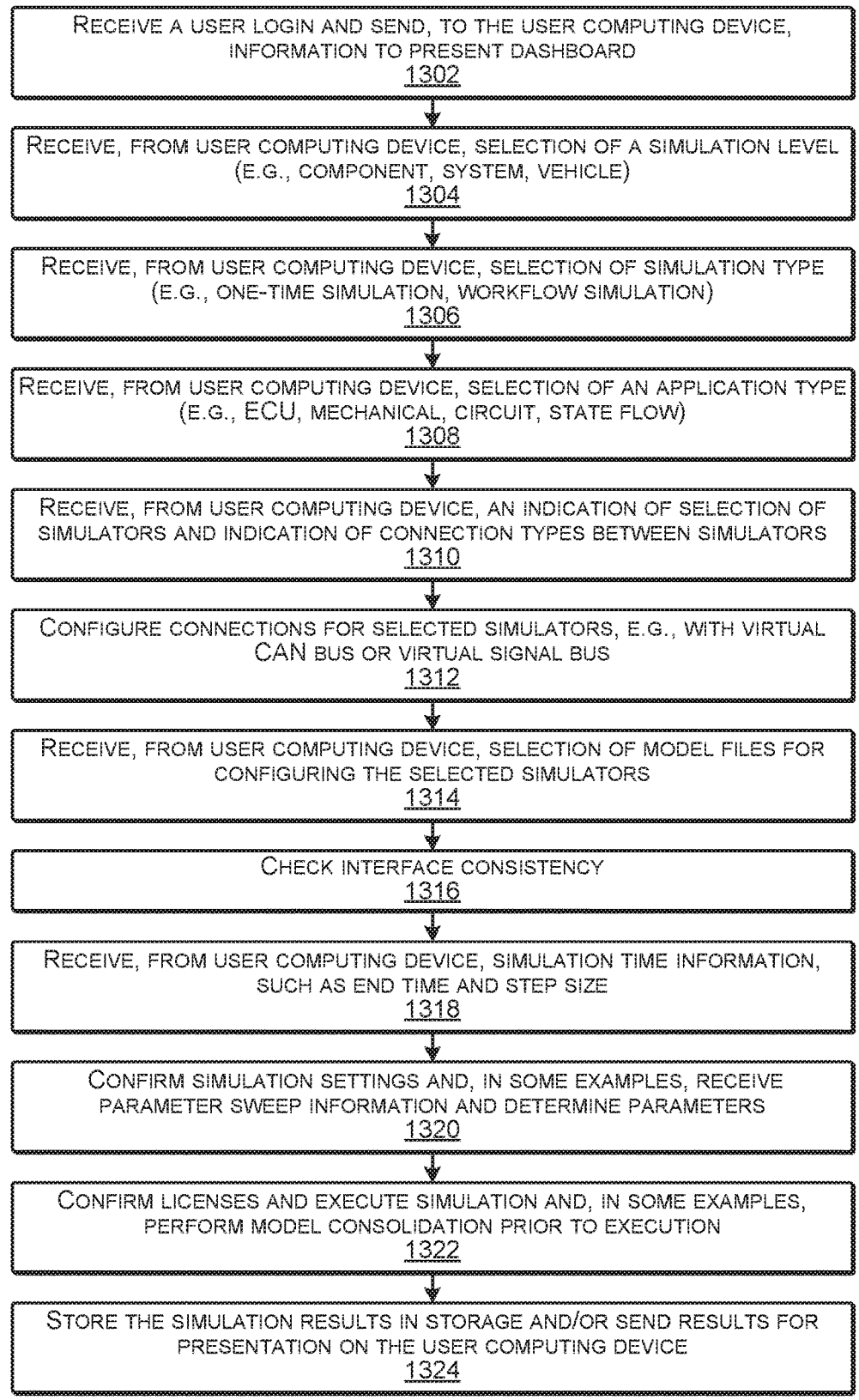
FIG. 13 is a flow diagram illustrating an example process for configuring a simulation according to some implementations.

FIG. 13 is a flow diagram illustrating an example process 1300 for configuring a simulation according to some implementations. In some examples, the process 1300 may be executed by one or more of the computing devices 104 included in the network computing resources 102 or other suitable computing devices.

At 1302, the one or more computing devices may receive a user login from a client computing device, and may send, to the client computing device, information to cause presentation of a dashboard GUI. For example, the dashboard may show that status of any current simulation jobs associated with the user.

At 1304, the one or more computing devices may receive, from the client computing device, a selection of a simulation level (e.g., component level, system level, vehicle level).

At 1306, the one or more computing devices may receive, from the client computing device, selection of simulation type (e.g., one-time simulation, workflow simulation).

At 1308, the one or more computing devices may receive, from the client computing device, selection of an application type (e.g., ECU, mechanical, circuit, state flow).

At 1310, the one or more computing devices may receive, from the client computing device, an indication of selection of simulators and indication of connection types between simulators.

At 1312, the one or more computing devices may configure a virtual bus and/or other virtual connections for selected simulators, as discussed above with respect to FIG. 6

At 1314, the one or more computing devices may receive, from the client computing device, selection of model files for configuring the selected simulators.

At 1316, the one or more computing devices may check interface consistency.

At 1318, the one or more computing devices may receive, from the client computing device, simulation time information, such as end time and step size.

At 1320, the one or more computing devices may confirm simulation settings. In addition, in some examples, a user may desire to perform a simulation that includes a parameter sweep in which multiple different parameters are applied to a model automatically. Thus, the user may provide parameter sweep information, as discussed additionally below with respect to FIGS. 23-24, and the one or more computing devices may be configured to execute one or more simulations using the indicated parameters.

At 1322, the one or more computing devices may confirm licenses and execute the simulation. For example, the simulation manager may check that the user has a sufficient number of licenses for executing the selected simulators. If the user has a sufficient number of licenses, but some are currently in use for another simulation, the simulation manager may delay the job until a sufficient number of licenses are available. If the user does not have a sufficient number of licenses, the simulation manager may cause the web interface to send a message to that effect on the client computing device associated with the user. In addition, such as based on user selection of "execute with consolidation" or by default, the one or more computing devices may attempt to consolidate models that are able to be consolidated, such as for minimizing license requirements and/or reducing the number of models to be executed by the simulation. As discussed additionally below with respect to FIGS. 25 and 26, models that use the same license and/or same simulator may be consolidated in some cases to reduce the number of licenses required for executing the simulation. Furthermore, the executing of the simulation may be at least partially based on the received end time and step size specified by the user, and may be further based on parameter sweep information provided for a parameter sweep, if applicable.

At 1324, following execution of the simulation, the one or more computing devices may store the simulation results in storage and/or send the results for presentation on the client computing device.

In some examples, the above process may include sending, by one or more processors, to a client computing device, information to enable the client computing device to present a graphic user interface (GUI), and receiving, from the client computing device, via the GUI, a first user input indicating an instruction to create a simulation including a plurality of simulators, which may include at least two processor simulators in some examples. The process may further include receiving, from the client computing device, via the GUI, an indication of a connection type between the simulators; receiving, from client computing device, via the GUI, an indication of a respective model file to associate with each simulator; allocating computing resources for executing the simulation; and executing the simulation by executing each simulator to execute the respective model file associated with each simulator. Furthermore, allocating the computing resources for executing the simulation may include allocating a respective virtual machine for each simulator, and may further include allocating a virtual machine for executing a simulation controller, where the simulation controller is configured to at least one of: monitor the executing of the simulation; or cause a result of the simulation to be sent to the client computing device.

Accordingly, the simulation platform herein may substantially reduce total simulation process time (e.g., by up to 80% in some cases). Further, users are able to use the GUI to set up and initiate large-scale, complex co-simulations with automated processes and template usage. Thus, the simulation platform herein reduces design rework by enabling simulation of large-scale systems much earlier in the development process than is possible with conventional systems. Further, as mentioned above, the simulation platform may consolidate models prior to running a simulation, and may manage simulator software licenses based on automated license allocation to oversee the efficient use of software licenses across multiple simulation jobs. Additionally, the simulation platform may scale automatically computing resources as needed to meet demand for simulation jobs of different sizes. The simulation platform may manage user permissions, virtual machine (VM) allocations, storage allocations, and the like. For example, users may detect product quality issues earlier in the design process with a vHILS approach that enables co-simulating large-scale virtual systems prior to physical prototyping. Further, the simulation platform herein may enhance cross-team, end-to-end simulation practices by using a standard simulation approach that builds team consistency, and collaboration, while reduce human error by significantly reducing data input requirements. Further, the simulation platform may protect simulation model data and all other information users upload to the platform with encryption and multi-factor authentication capabilities. In addition, the storage provided by the network computing resources may employ enterprise-class security, disaster recovery, and backup capabilities.

Figure 14:
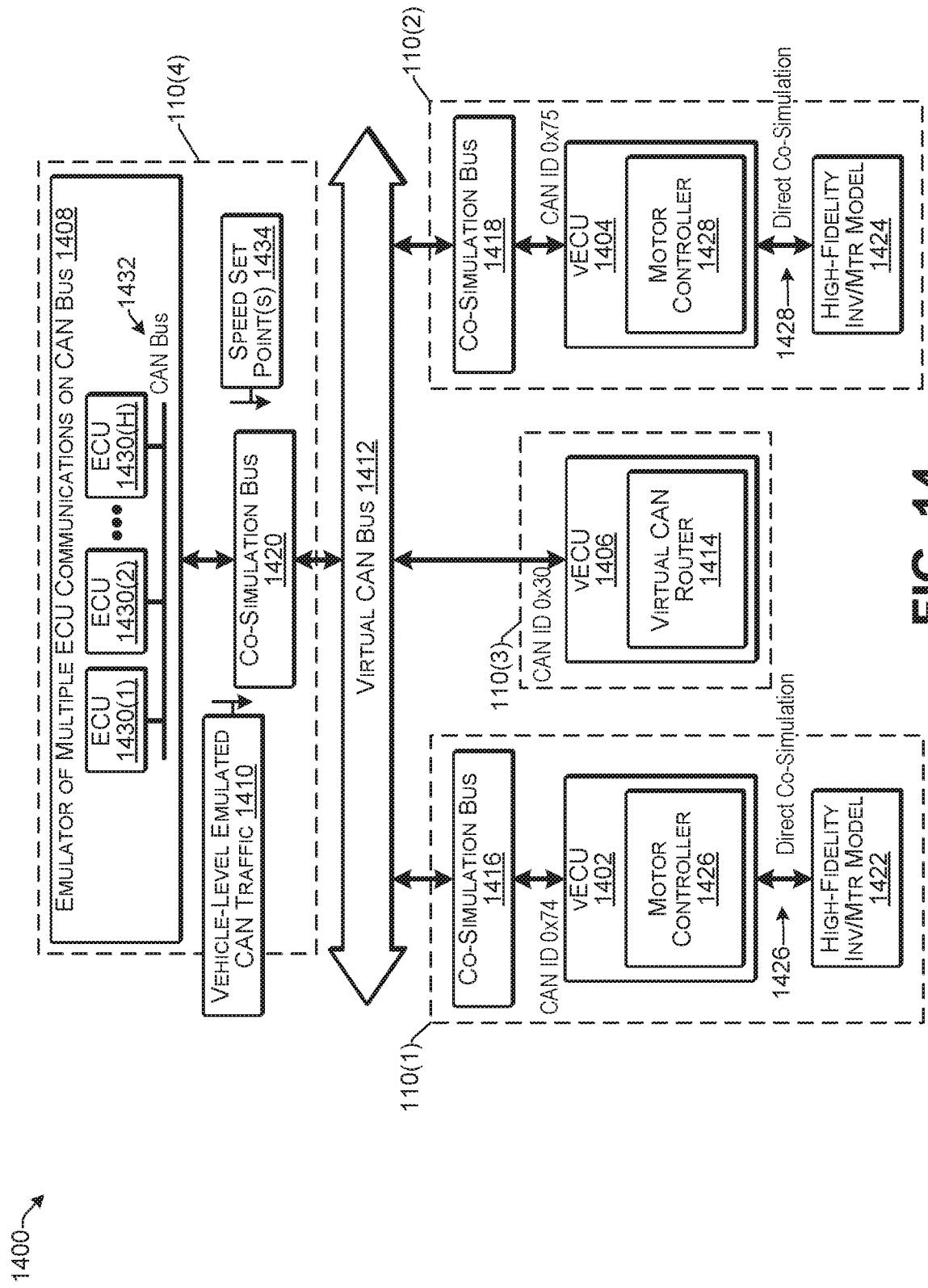
FIG. 14 illustrates an example co-simulation according to some implementations.

FIG. 14 illustrates an example co-simulation 1400 according to some implementations. For instance, the co-simulation 1400 may be configured on the simulation platform 108 discussed above with respect to FIG. 1 using the GUI described above with respect to FIGS. 3-13. The example of FIG. 14 represents a virtual multi-ECU high fidelity cyber-physical multi-rate co-simulation that closely resembles a realistic hardware-based automotive embedded system. This example includes two inverter/motor control vECUs 1402 and 1404, and a CAN router vECU 1406 coupled with an emulator 1408 that is able to provide abstracted vehicle-level emulated CAN traffic 1410. For instance, as discussed additionally below, the emulator 1408 may generate emulated CAN traffic 1410 that may occupy the communication network during simulation, similar to a real-world system.

Simulations including multiple ECUs, such as that illustrated in FIG. 14, may enable system design optimization and vehicle-level design optimization by allowing virtual experimentation and comparison of different E/E architectures with respect to a plurality of ECUs, system performance, and the selected microcontroller and hardware components. The simulation creation methodology and GUI discussed above with respect to FIGS. 1-13 may be used to create the co-simulation 1400 and/or other desired simulations. The network computing resources discussed above may be scaled automatically to support the created simulations to enable component-level, system-level, and vehicle-level software development early in the design phase to reduce significantly the overall development time for a vehicle.

The simulation of FIG. 14 may employ processor simulators, i.e., models of ECUs referred to herein as vECUs, as discussed above, such as with respect to FIG. 1, which are configured to execute the actual binary software that would otherwise execute on the real chip in the real-world ECU. These vECUs may be highly accurate lower abstraction representations of corresponding real-world ECUs, and may correspond to particular brands or types of ECUs. As one example, suitable vECU models of ECUs of various different ECU manufacturers are commercially available from Synopsys Inc. of Mountain View, Calif. For instance, in some cases, the vECUs 1402 and 1404 may correspond to a first brand of ECU available from a first manufacturer, and the vECU 1406 may correspond to a second brand of ECU available from a second manufacturer that is different from the first manufacturer. Accordingly, in some cases, the vECUs 1402 and 1404 may have at least one performance parameter that is different from that of the vECU 1406. Alternatively, in other cases, the vECUs 1402, 1404, and 1406 may all use the same processor simulator.

The example of FIG. 14 incorporates multiple vECUs together and integrates these vECUs using a virtual Controller Area Network (CAN) bus, similar to the way real-world ECUs may be integrated for communication with each other in a vehicle. By simulating such a virtual multi-ECU framework, the example of FIG. 14 may be used to perform E/E design optimization for speed and performance, as well as choice of hardware. Furthermore, using the simulation platform herein, the example of FIG. 14 may be expanded to include concurrent co-simulation of additional systems and/or entire vehicle-level multi-ECU co-simulation. For instance, as discussed additionally below with respect to FIG. 18, the emulator 1408 in this example may be replaced with a plurality of additional vECUs in some examples.

In this example, the simulation communication between multiple vECUs is enabled by virtual CAN bus 1412. For example, a virtual CAN router 1414 that executes on the vECU 1404 in the co-simulation 1400 may manage some vehicle-level vECU communications over the virtual CAN bus 1412. Further, system-level vECU communications between the vECU 1402 and the vECU 1404 may be communicated based on configuration of a co-simulation bus, such as is available from ChiasTek Inc. of Chicago, Ill. For example a first instance 1416 of the co-simulation bus may be implemented with the vECU 1402, a second instance, 1418 of the co-simulation bus may be implemented with the vECU 1404, and a third instance 1420 of the co-simulation bus may be implemented with the emulator 1408.

The vECU 1402 may be connected for communication with a first plant simulator, which in this example is a first instance 1422 of a high-fidelity inverter/motor model. In addition, the vECU 1404 may be connected for communication with a second plant simulator, which may be a second instance 1424 of the high-fidelity inverter/motor model. For example, as indicated at 1426 and 1428, respectively, the high-fidelity inverter/motor models 1422 and 1424 may communicate with the respective vECUs 1402 and 1404 by direct co-simulation, which may correspond to the signal bus connection discussed above, e.g., with respect to FIG. 6. As an example of direct co-simulation, the high-fidelity inverter/motor model 1422 may execute on the same virtual machine as the vECU 1402, and the high-fidelity inverter/motor model 1424 may execute on the same virtual machine as the vECU 1404. Additional details of the direct co-simulation are discussed below with respect to FIG. 15.

Further, the vECU 1402 may execute software for a first motor controller 1426 and the vECU 1404 may execute software for a second motor controller 1428. Accordingly, as one example, the co-simulation 1400 may be used to test the motor controllers 1426 and 1428, such as for determining that the motor controllers 1426 and 1428 respond as intended to external control signals, interact with each other as intended, and output control signals to respective the high-fidelity inverter/motor models, as intended.

As discussed above, in some examples, each of the vECUs 1402, 1404, and 1406 may execute on a separate virtual machine provided by the simulation platform 108 of FIG. 1. For example, the vECU 1402, the co-simulation bus instance 1416 and the high-fidelity inverter/motor model instance 1422 may execute on a first virtual machine 110(1); the vECU 1404, the co-simulation bus instance 1418 and the high-fidelity inverter/motor model instance 1424 may execute on a second virtual machine 110(2); the vECU 1406 may execute on a third virtual machine 110(3); and the emulator 1408 and the co-simulation bus instance 1420 may execute on a fourth virtual machine 110(4). In other examples, other configurations of virtual machines and/or physical machines may be used.

As mentioned above, the emulator 1408 may be a simulator configured to emulate the vehicle-level CAN traffic of a plurality of ECUs 1430(1), 1430(2), ..., 1430(H) communicating over a CAN bus 1432. As one example, the emulator 1408 may be available from Symtavision Inc. of Troy, Mich. The emulator 1408 may pass the vehicle-level emulated CAN traffic onto the virtual CAN bus 1412 via the co-simulation bus 1420. In addition, the emulator 1408 may be configured to send, over the virtual CAN bus 1412, one or more speed set points 1434 for controlling the virtual speed of the high-fidelity inverter/motor models 1422, 1424. The virtual CAN router 1414 may receive a CAN message from the emulator 1408 with the speed set point 1434 as a payload, and may propagate this CAN message to each of the vECU 1402 and the vECU 1404 with respective CAN identifiers (IDs). For instance, each vECU on the virtual CAN bus 1412 may be assigned a CAN ID that is unique with respect to the virtual CAN bus 1412, or otherwise individually distinguishable. In this example, vECU 1402 is associated with CAN ID 0x74, vECU 1404 is associated with CAN ID 0x75, and vECU 1406 is associated with CAN ID 0x30.

The virtual CAN bus 1412 and the virtual CAN router 1414 may pass CAN communications using TCP/IP protocol, such as over Ethernet, fiber optic, or the like, depending on the network type connecting the virtual machines 110(1)-110(4). In this example only one virtual CAN bus is used; however, in other examples, the router may be configured to emulate multiple CAN buses. Further, in FIG. 14, a direct connection is shown between the CAN router vECU 1406 and the virtual CAN bus 1412 without a co-simulation bus in between. The may be achieved by using the vECU 1406 itself to host the CAN bus 1412 to which the other vECUs 1402 and 1404, and the emulator 1408 interface via respective co-simulation buses 1416, 1418 and 1420. When the virtual CAN router 1414 receives the speed set point 1434 from the emulator 1408, the virtual CAN router 1414 may propagate this communication to both of the vECUs 1402 and 1404 using their respective CAN IDs. One example output of the co-simulation 1400 may be a graph showing three phase inverter/motor speed control output for each plant simulator 1422, 1424.

Figure 15:
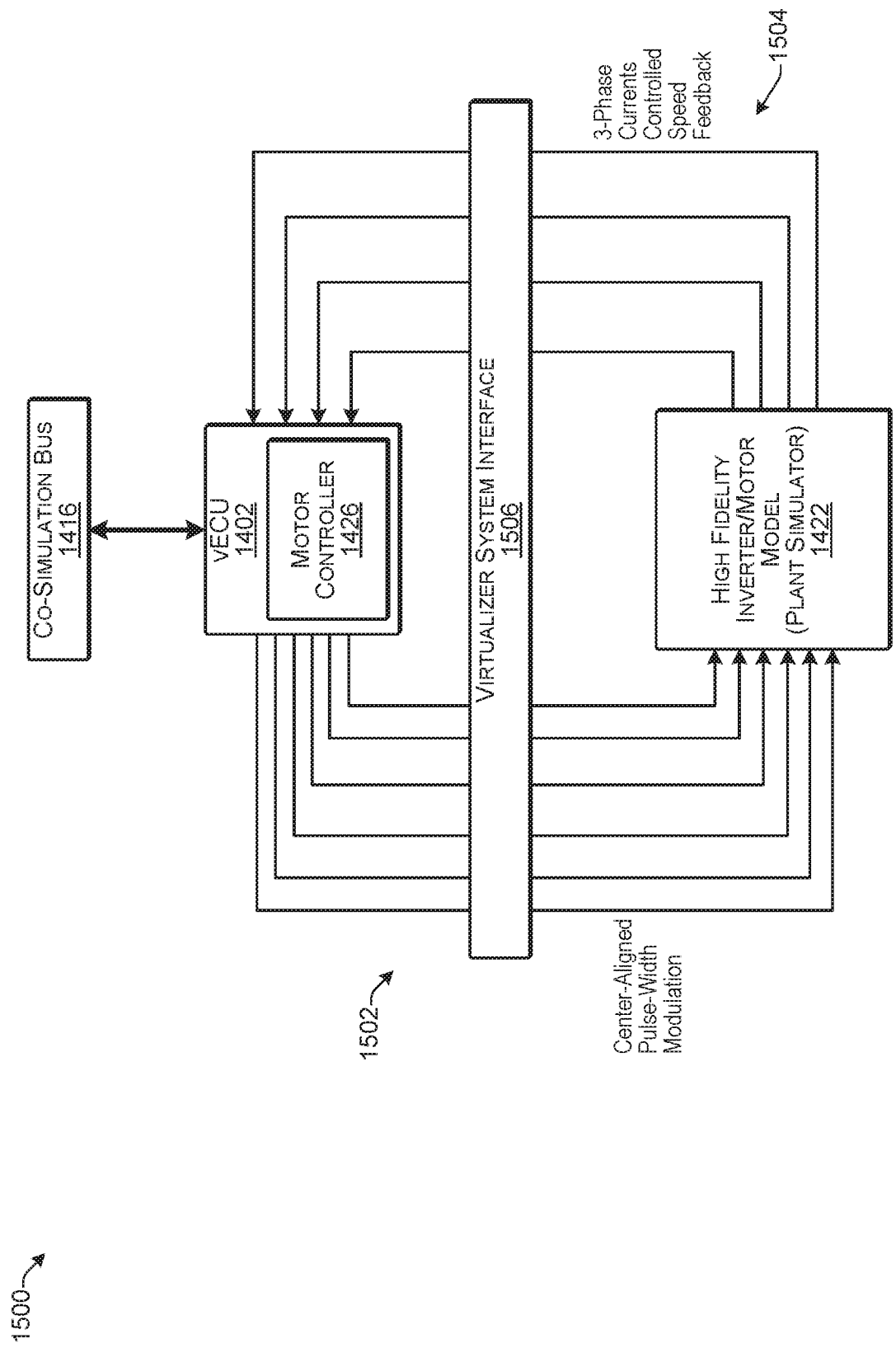
FIG. 15 illustrates an example of the interaction between the motor controller and the high-fidelity inverter/motor model according to some implementations.

FIG. 15 illustrates an example 1500 of the interaction between the motor controller 1426 and the high-fidelity inverter/motor model 1422 according to some implementations. As one example, the plant model may be characterized with data from a real inverter/motor product, such as is available from Hitachi Automotive Systems Americas, Inc., of Harrodsburg, Ky. In this example, a first set of signals 1502 may be center aligned pulse-width modulated (PWM) outputs generated by the motor controller 1426 executing on the vECU 1402. Furthermore, a second set of signals 1504 may be analog-to-digital converter (ADC) input signals for three phase currents and the controlled speed (feedback) to the motor controller 1426.

In this example, a direct co-simulation interface using WINDOWS® shared memory may be used to enable connecting and co-simulating in a point-to-point fashion the processor simulator, vECU 1402 and the plant simulator 1422. In the illustrated example, this shared memory direct co-simulation interface is represented as a virtualizer system interface 1506. The direct co-simulation between the vECU 1404 and the high-fidelity inverter/motor model 1424 may be similarly configured.

Figure 16:
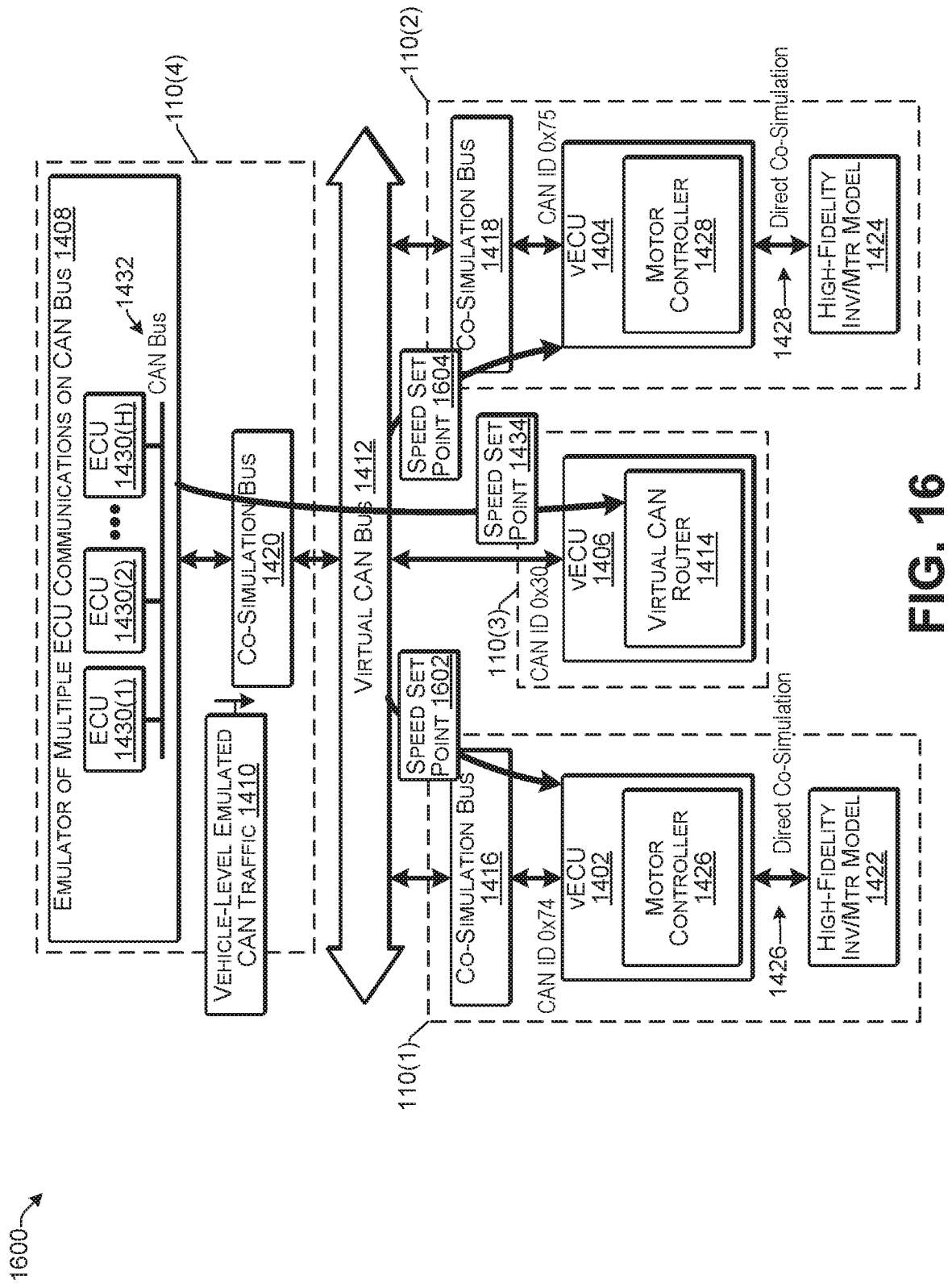
FIG. 16 illustrates an example of the operation of the CAN router and the virtual CAN bus in the co-simulation of FIG. 14 according to some implementations.

FIG. 16 illustrates an example 1600 of the operation of the CAN router and the virtual CAN bus in the co-simulation of FIG. 14 according to some implementations. As mentioned above, vECU 1402 and vECU 1404 each have a respective statically assigned CAN ID, i.e., 0x74 and 0x75, respectively. In addition, the vECU 1406 also has a statically assigned CAN ID, 0x30. The virtual CAN router 1414 may receive a CAN message from the emulator 1408 with the speed set point 1434 as a payload and may propagate this message to the vECU 1402 and vECU 1404 with the respective CAN IDs. The CAN router vECU 1406 may be connected to two different layers of simulation, one with low fidelity at the vehicle level and one with high fidelity at the system level. This may provide a very realistic use-case of a part of an automotive E/E architecture. In addition, the vehicle level simulation in this example may be the abstracted multi-ECU vehicle level CAN traffic emulator 1408, while the system level simulation includes high-fidelity inverter/motor models 1422, 1424 and the motor controllers 1426 and 1428 working at lower abstraction and high fidelity.

The CAN router accepts a CAN message sent to the virtual CAN Bus 1412 at the statically defined router CAN ID 0x30, duplicates the message, and sends the message to the vECU 1402 and the vECU 1404 over the virtual CAN Bus 1412. The respective vECUs 1402 and 1404 receive the respective messages, and execute the respective motor controllers 1426 and 1428 with the target speed set-point acquired from the CAN message payload.

In addition, for the vehicle-level emulated CAN traffic 1410, the majority of frames produced during the co-simulation contain no actual signal data. Instead, payload specification may be implemented at a more abstract level by just defining the minimum and maximum amount of data (e.g., in Bytes) contained in each frame. In addition, frames may be specified with correct CAN IDs and precise activation patterns, and therefore may occupy the communication network including the virtual CAN bus 1412 during simulation, just as in a real-world system. In the emulator 1408, all ECUs 1430 may be black-box containers such that only the behavior at their networking interface is included in the emulator model. Thus, the modeling approach taken for the black-box containers might not use a specification of actual frame payloads, but just the definition of minimum and maximum payload size. For the purpose of interfacing these black-box models with the functional vECUs 1402, 1404 and 1406, dedicated interface frames using the CAN IDs may be assigned a predefined value, or a sequence of values, together with a transmission pattern (like once every 10 ms). This may provide the ability to induce set values from ECUs in the vehicle that were not a part of the high fidelity models. Conversely, frames sent by the vECUs 1402, 1404, and 1406 may be consumed by the emulator 1408.

As illustrated in FIG. 16, the motor speed set point 1434 is sent from the emulator 1408 to the virtual CAN router 1414 through the virtual CAN bus 1412. The virtual CAN router 1414 receives the motor speed set point 1434, decodes the message, and generates two duplicated outgoing CAN messages with the same payload that are sent back out on the virtual CAN bus 1412. A first motor speed set point message 1602 uses the CAN ID 0x74, and is therefore received at the vECU 1402, and a second motor speed set point message 1604 uses the CAN ID 0x75, and is therefore received at the vECU 1404.

Figure 17:
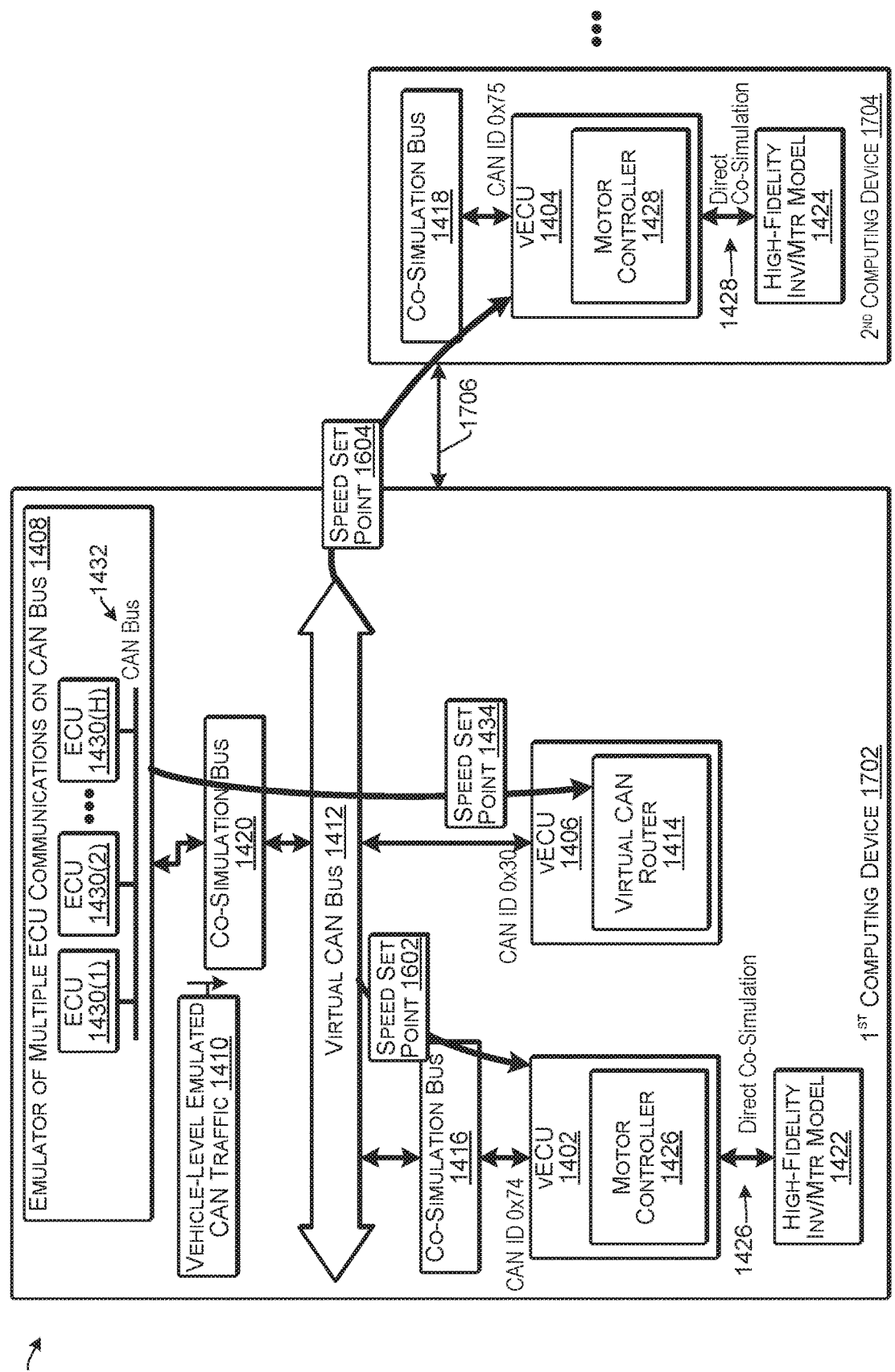
FIG. 17 illustrates an example of the co-simulation arrangement of FIG. 16 configured for execution on a plurality of physical computing devices according to some implementations.

FIG. 17 illustrates an example of the co-simulation arrangement of FIG. 16 configured on a system 1700 including plurality of physical computing devices according to some implementations. For instance, the system 1700 may include at least a first computing device 1702 and a second computing device 1704. The vECUs 1402 and 1406, the emulator 1408, the virtual CAN bus 1412, and the inverter/motor model 1422 may be configured to execute on the first computing device 1702 and the vECU 1428 and the inverter/motor model 1424 may be configured to execute on the second computing device 1704. The first computing device 1702 and the second computing device 1704 may be configured to communicate through a connection 1706, which may be a direct connection, a LAN, or any of the one or more networks 124 described above. As one example, the connection 1706 may be an Ethernet connection, and the co-simulation bus 1418 may communicate over the connection 1706 with the virtual CAN bus 1412 and the co-simulation buses 1416 and 1420. Thus, the speed set point 1604 may be communicated to the vECU 1404 through the connection 1706 as if through a CAN bus, as described above with respect to FIG. 16.

The computing devices 1702 and 1704 may be any of a variety of physical computing devices such as personal computers, servers, workstations, laptops, or the like. In some examples, the simulators and the emulator may execute directly on the computing devices 1702 and 1704. In other examples, the computing devices 1702 and/or 1704 may implement virtual machines, and the simulators and emulator may execute on the virtual machines. Further, as another alternative, the vECU 1406 and/or the emulator 1408 may execute on one or more additional physical computing devices separate from the vECU 1402 and/or each other. Numerous other variations will be apparent to those of skill in the art having the benefit of the disclosure herein.

Figure 18:
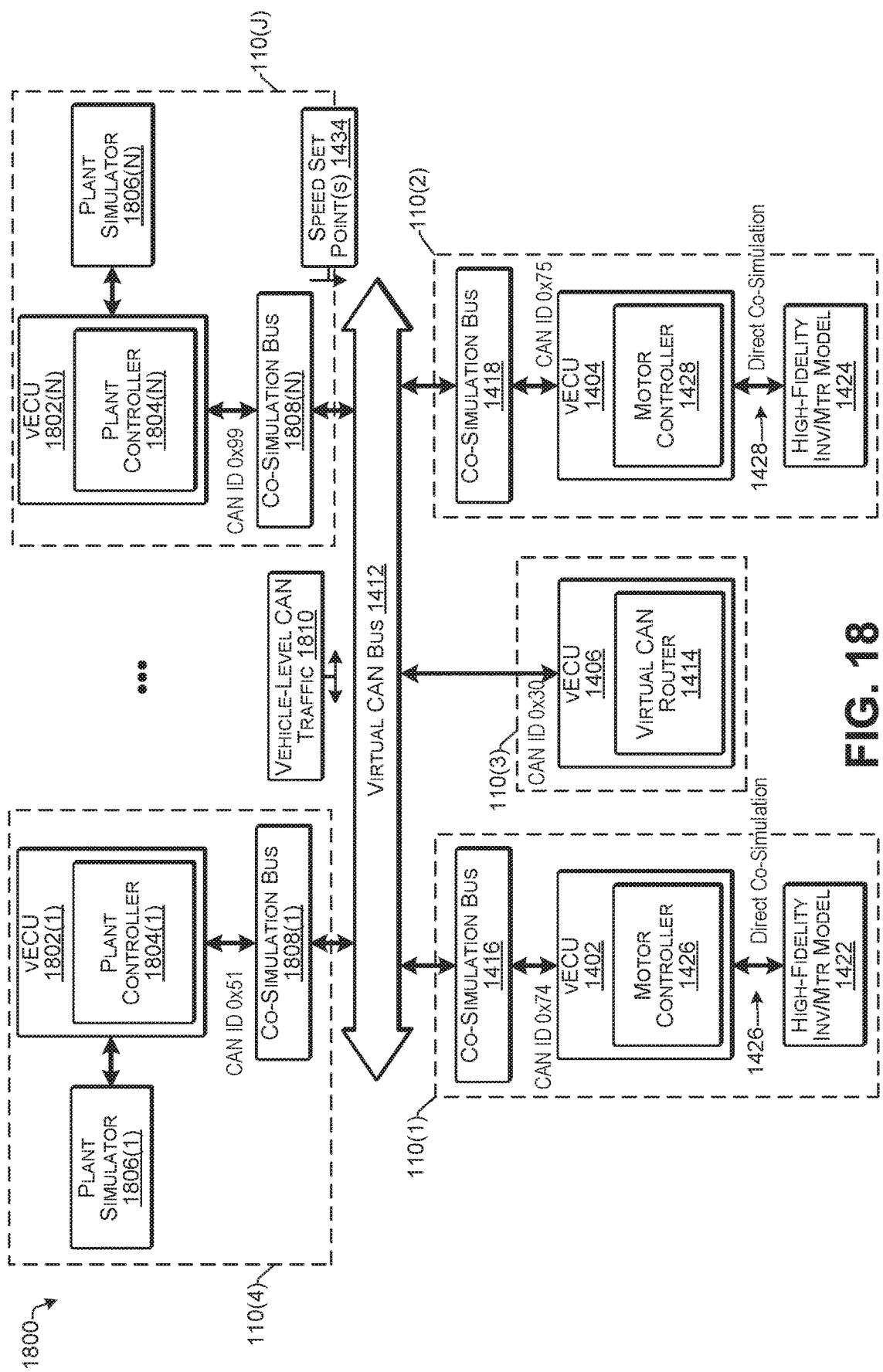
FIG. 18 illustrates an example co-simulation that includes a plurality of vECUs according to some implementations.

FIG. 18 illustrates an example co-simulation 1800 that includes a plurality of vECUs according to some implementations. In this example, the co-simulation described above with respect to FIG. 14 is modified to remove the emulator 1408, and add a plurality of vECUs 1802(1)-1802(N), each of which may be implemented on a separate virtual machine 110(4)-110(J). Further, each vECU 1802(1)-1802(N) may have an associated CAN ID that is unique within the co-simulation or otherwise individually distinguishable. In addition, some or all of the vECUs 1702(1)-1802(N) may have plant controllers installed thereon for execution, such as plant controllers 1804(1)-1804(N). Additionally, some or all of the vECUs 1802(1)-1802(N) may have connected plant simulators, such as plant simulators 1806(1)-1806(N). Furthermore, some or all of the vECUs 1802(1)-1802(N) may be connected for communication with the virtual CAN bus 1412, or another virtual CAN bus, instances 1808(1)-1808(N) of the co-simulation bus.

The co-simulation 1800 may be created as discussed above using the GUI described in FIGS. 3-12. In addition, one or more of the vECUs 1802 may execute a controller that is configured to send speed set points 1434, such as to the virtual CAN router 1414 for forwarding to the vECUs 1402 and 1404. In addition, the other vECUs 1802 may execute the controller software, or the like, installed thereon to simulate other components of systems in the vehicle. Accordingly, when the co-simulation 1800 is executed, realistic vehicle level CAN traffic 1810 traverses the virtual CAN bus 1412, providing a vehicle level co-simulation. One example output of the co-simulation 1800 may be a graph showing three-phase inverter/motor speed control output, but numerous other outputs may be generated from the other vECUs 1802(1)-1802(N), depending on the type of software installed and the type of plant simulators connected thereto.

Figure 19:
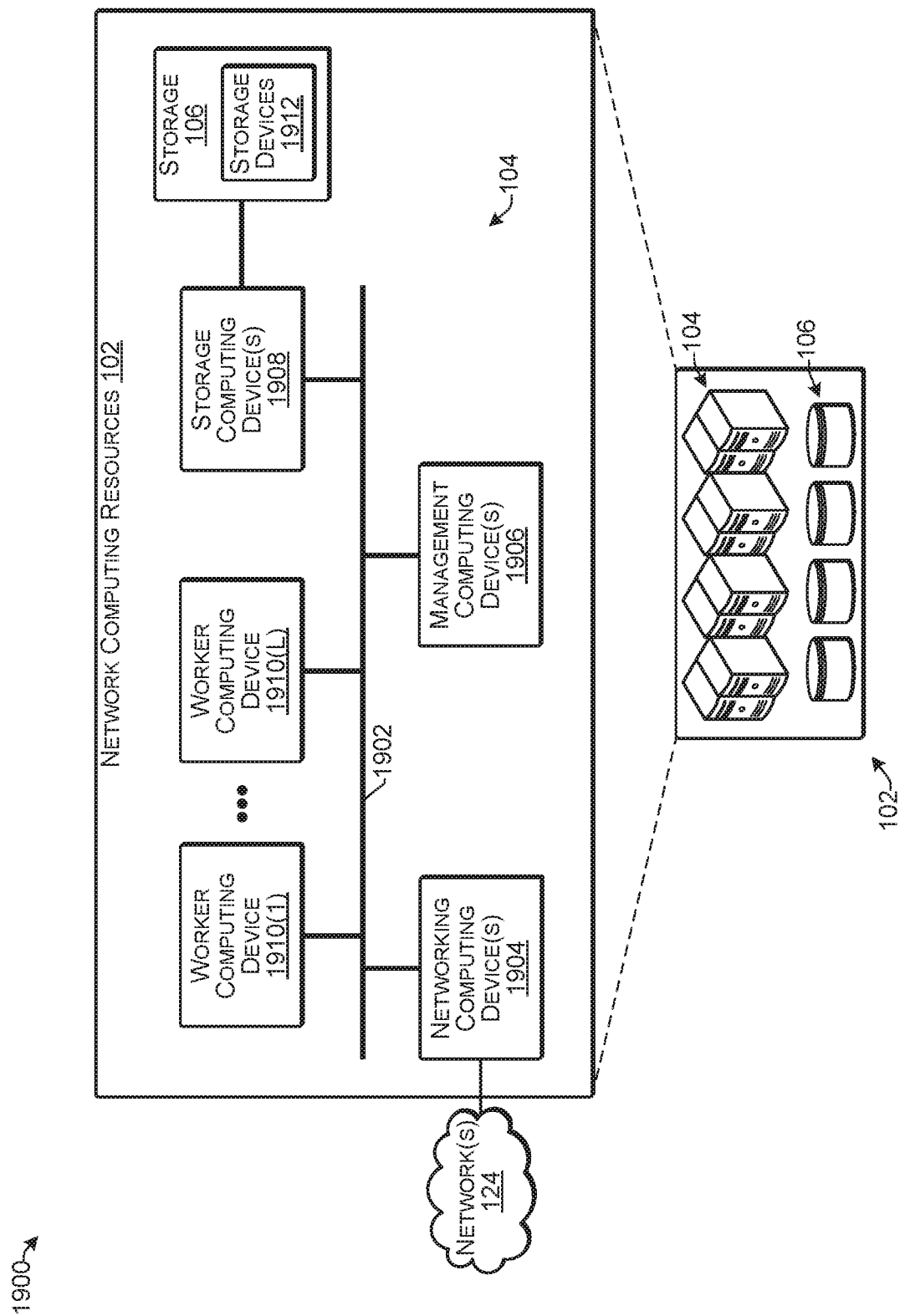
FIG. 19 illustrates an example architecture of a physical layer of the network computing resources according to some implementations.

FIG. 19 illustrates an example architecture 1900 of a physical layer of the network computing resources according to some implementations. The architecture 1900 includes a plurality of the physical computing devices 104 able to communicate with each other over one or more networks 1902. In some examples, the one or more networks 1902 may be a LAN, while in other examples, the one or more networks may be any of the types of networks discussed above with respect to the one or more networks 124. The computing devices 104 may be selectably configured to perform one or more designated functions as part of the network computing resources 102. For instance one or more networking computing devices 1904 may be configured to send and receive communications over the one or more networks 124; one or more management computing devices 1906 may be configured to manage the overall network resources; one or more storage computing devices 1908 may be configured to manage storage of data on the storage 106; and a plurality of worker computing devices 1910(1)-1910(L) may be configurable for performing various functions such as for providing virtual machines or physical machines for use as allocated network computing resources.

Additionally, in an alternative configuration, some or all of the networking computing devices 1904, management computing devices 1906, and/or storage computing devices 1908 may be implemented as virtual machines. Further, while several example system architectures have been discussed herein, numerous other system architectures will be apparent to those of skill in the art having the benefit of the disclosure herein.

The storage 106 may include any type of technology for storage of information and may include a plurality of storage devices 1912. For example, the storage devices 1912 may include, but are not limited flash memory or other memory technology, optical storage, solid state storage, magnetic tape, magnetic disk storage, RAID storage systems, storage arrays, network attached storage, storage area networks, or any other medium that can be used to store information and that can be accessed by a computing device. Depending on the configuration of the storage 106, the storage devices 1912 may be a tangible non-transitory computer readable media to the extent that, when mentioned, non-transitory computer-readable media exclude media such as energy, carrier signals, electromagnetic waves, and/or signals per se.

Figure 20:
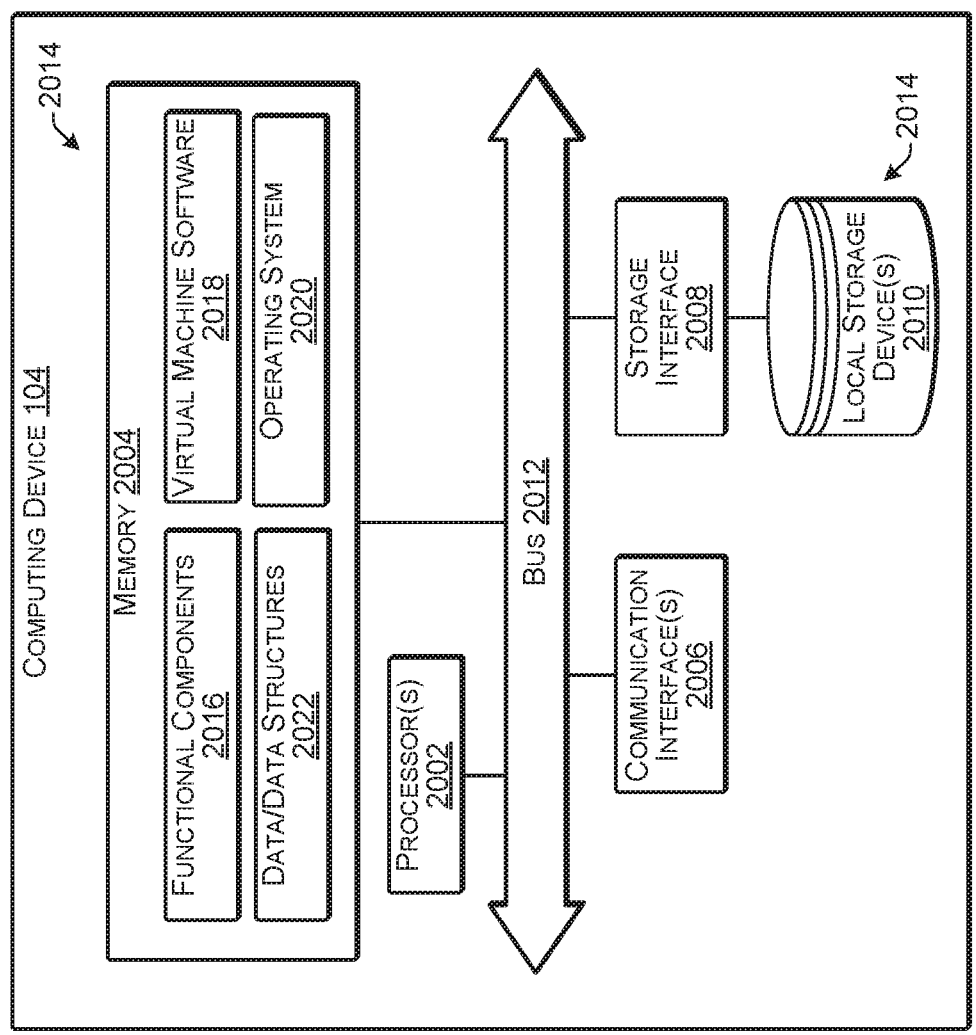
FIG. 20 illustrates select components of an example computing device according to some implementations.

FIG. 20 illustrates select components of an example computing device 104 according to some implementations. In some examples, the computing device 104 may include one or more servers or other types of computing devices that may be embodied in any number of ways. For instance, in the case of a server, the modules, other functional components, and data storage may be implemented on a single server, a cluster of servers, a server farm or data center, and so forth, although other computer architectures may additionally, or alternatively, be used. In the illustrated example, the computing device 104 may include, or may have associated therewith, one or more processors 2002, a memory 2004, one or more communication interfaces 2006, a storage interface 2008, one or more local storage devices 2010, and a bus 2012.

Each processor 2002 may be a single processing unit or a number of processing units, and may include single or multiple computing units, or multiple processing cores. The processor(s) 2002 can be implemented as one or more central processing units, microprocessors, microcomputers, microcontrollers, digital signal processors, state machines, logic circuitries, and/or any devices that manipulate signals based on operational instructions. For instance, the processor(s) 2002 may be one or more hardware processors and/or logic circuits of any suitable type specifically programmed or configured to execute the algorithms and processes described herein. The processor(s) 2002 can be configured to fetch and execute computer-readable instructions stored in the memory 2004, which can program the processor(s) 2002 to perform the functions described herein. Data communicated among the processor(s) 2002 and the other illustrated components may be transferred via the bus 2012 or other suitable connection.

The local storage device(s) 2010 may be at the same location as the computing device 104, and may be used for storing data at least temporarily. In some examples, the computing device 104 may use the storage 106 discussed above in addition to, or instead of the local storage devices 2010. The storage interface 2008 may provide raw data storage and read/write access to the local storage device(s) 2010 and/or to the storage 106.

The memory 2004, the local storage device(s) 2010, and the storage 106 discussed above (not shown in FIG. 20) are examples of computer-readable media 2014. Such computer-readable media 2014 may include volatile and non-volatile memory and/or removable and non-removable media implemented in any type of technology for storage of information, such as computer-readable instructions, data structures, program modules, or other data. For example, the computer-readable media 2014 may include, but is not limited to, RAM, ROM, EEPROM, flash memory or other memory technology, optical storage, solid state storage, magnetic tape storage, magnetic disk storage, RAID storage systems, storage arrays, network attached storage, storage area networks, or any other medium that can be used to store the desired information and that can be accessed by a computing device. Depending on the configuration of the computing device 104, the computer-readable media 2014 may be a type of computer-readable storage media and/or may be a tangible non-transitory media to the extent that when mentioned, non-transitory computer-readable media exclude media such as energy, carrier signals, electromagnetic waves, and/or signals per se.

The computer-readable media 2014 may be used to store any number of functional components 2016 that are executable by the processor(s) 2002. In many implementations, these functional components 2016 comprise instructions or programs that are executable by the processor(s) 2002 and that, when executed, specifically configure the processor(s) 2002 to perform the actions attributed herein to the computing device 104. In addition, in some examples, the computer-readable media 2014 may include virtual machine software 2018, such as is available from VMware, Inc., of Palo Alto, Calif., to enable implementation of one or more virtual machines on the computing device 104. Further, the computer-readable media 2014 may include an operating system 2020 for controlling and managing various functions of the computing device 104.

In addition, the computer-readable media 2004 may store data and data structures 2022 used for performing the functions and services described herein. The computing device 104 may also include or maintain other components and data, which may include programs, drivers, etc., and associated data. Further, the computing device 104 may include many other logical, programmatic, and physical components, of which those described above are merely examples that are related to the discussion herein.

The communication interface(s) 2006 may include one or more interfaces and hardware components for enabling communication with various other devices, such as over the one or more networks 124. For example, the communication interface(s) 2006 may enable communication through one or more of a LAN, WAN, the Internet, cable networks, cellular networks, wireless networks, wired networks (e.g., fiber optic, Ethernet, Fibre Channel), direct connections, and the like, as additionally enumerated elsewhere herein.

Further, while FIG. 20 illustrates the components and data of the computing device as being present in a single location, these components and data may alternatively be distributed across different computing devices and different locations in any manner. Consequently, the functions may be implemented by one or more computing devices, with the various functionality described above distributed in various ways across the different computing devices. The described functionality may be provided by the servers of a single entity or enterprise, or may be provided by the servers and/or services of multiple different enterprises. In addition, the client computing devices 122, the management computing devices 132, and/or the computing devices 1702 and 1704 may include hardware configurations similar to those described above, but may include different functional components, software, and so forth.

Figure 21:
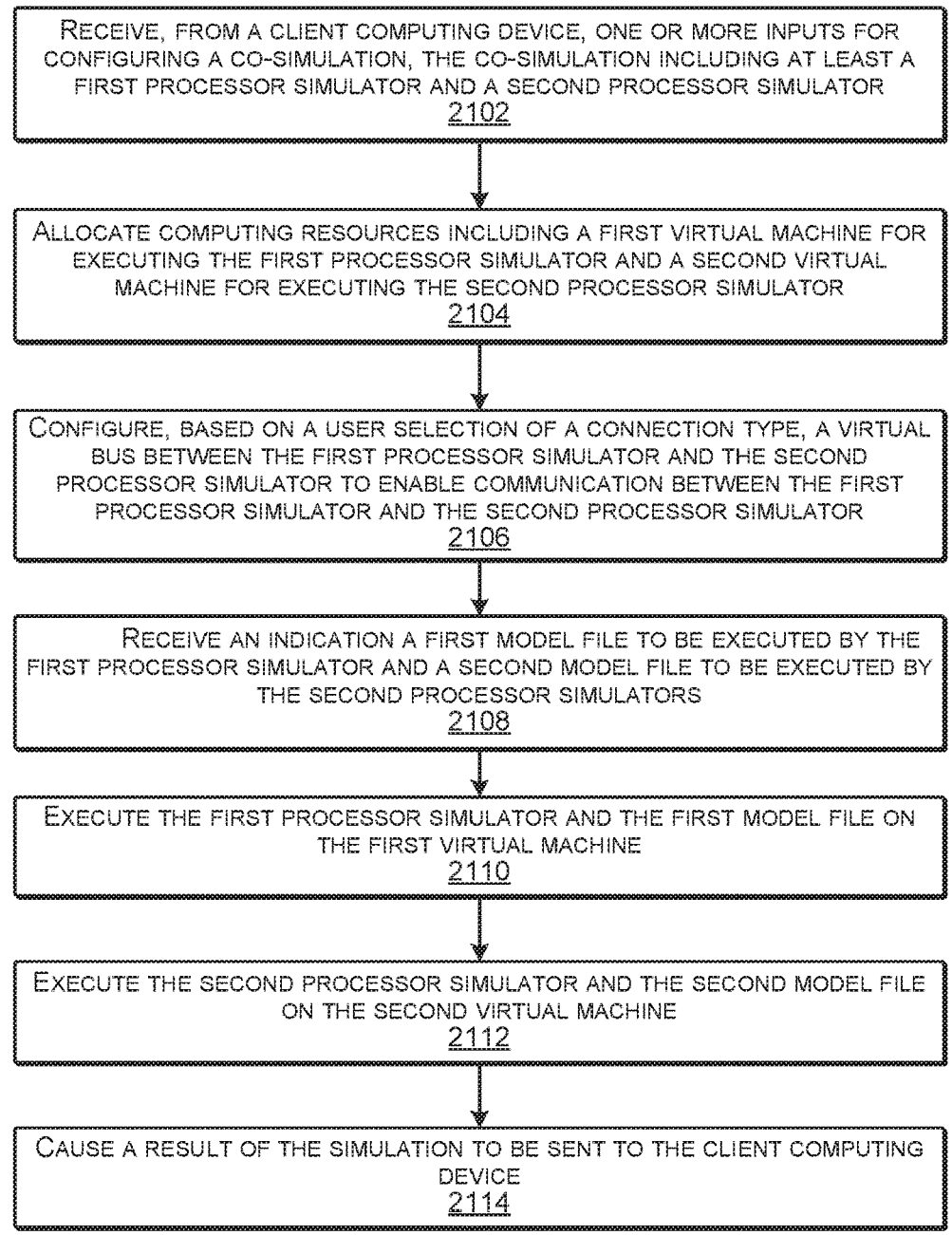
FIG. 21 is a flow diagram illustrating an example process for executing a simulation according to some implementations.

FIG. 21 is a flow diagram illustrating an example process 2100 for executing a simulation according to some implementations. In some examples, the process 2100 may be executed by one or more computing devices associated with the network computing resources, or other suitable computing devices.

At 2102, the one or more computing devices may receive, from a client computing device, one or more inputs for configuring a co-simulation, the co-simulation including at least a first processor simulator and a second processor simulator.

At 2104, the one or more computing devices may allocate computing resources including a first virtual machine for executing the first processor simulator and a second virtual machine for executing the second processor simulator.

At 2106, the one or more computing devices may configure, based on a user selection of a connection type, a virtual bus between the first processor simulator and the second processor simulator to enable communication between the first processor simulator and the second processor simulator.

At 2108, the one or more computing devices may receive an indication of a first model file to be executed by the first processor simulator and a second model file to be executed by the second processor simulators.

At 2110, the one or more computing devices may execute the first processor simulator and the first model file on the first virtual machine.

At 2112, the one or more computing devices may execute the second processor simulator and the second model file on the second virtual machine.

At 2114, the one or more computing devices may cause a result of the simulation to be sent to the client computing device.

In some examples, a system such as that described in FIG. 1, may include one or more processors configured to perform the process described above, and may execute the co-simulation including the first processor simulator and the second processor simulator, so that at least one communication is passed between the first processor simulator and the second processor simulator. In some examples, the co-simulation may further include a first plant simulator and a second plant simulator, and the one or more processors may configure a second virtual connection between the second plant simulator and the second processor simulator. In addition, the virtual bus may be a virtual controller area network bus configured to operate using a TCP/IP protocol, and the first virtual connection and second virtual connection may be configured as direct co-simulation interfaces that use shared memory. Furthermore, the one or more processors may configure a third processor simulator on a third virtual machine for executing a virtual router for receiving a communication via the virtual bus and for sending the communication to at least one of the first processor simulator or the second processor simulator.

In addition, the one or more processors may configure a fourth virtual machine able to communicate with the virtual bus. The fourth virtual machine may be configured to execute at least one of: a fourth processor simulator configured to send a control signal for controlling at least one of the first plant or the second plant, where the router is configured to receive the control signal and send the control signal to at least one of the first processor simulator or the second processor simulator; or an emulator for sending simulated bus traffic via the virtual bus.

Additionally, prior to receiving the one or more inputs from the client computing device, the one or more processors may send, to the client computing device, information for presenting a GUI on the client computing device, the GUI including virtual controls to enable selection of a configuration of the co-simulation. The one or more processors may receive, from the client computing device, via the GUI, the one or more inputs for configuring the co-simulation. Furthermore, the one or more processors may receive, from the client computing device, via the GUI, time information indicating at least an end time for the co-simulation; may receive, from the client computing device, via the GUI, an instruction requesting execution of the co-simulation; and at least partially in response to receiving the instruction, may execute the co-simulation according to the time information. In addition, the one or more processors may allocate an additional virtual machine on one of the computing devices, and may execute a simulation controller on the additional virtual machine. For instance, the simulation controller may be configured to at least one of: monitor the executing of the simulation; or cause the result of the simulation to be sent to the client computing device.

Additionally, the system may include a plurality of physical computing devices and a storage. One or more of the physical computing devices may be programmed to receive, from a client computing device, an indication of a simulation including a first processor simulator and a second processor simulator; allocate, on one or more of the physical computing devices, a first virtual machine for the first processor simulator and a second virtual machine for the second processor simulator; configure a virtual connection between the first processor simulator and the second processor simulator; receive an indication of a first model file to be executed by the first processor simulator and a second model file to be executed by the second processor simulator; execute the first processor simulator and the first model file on the first virtual machine; and execute the second processor simulator and the second model file on the second virtual machine. The system may include a plant simulator configured on one of the virtual machines, and the one or more physical computing devices may be programmed to configure a virtual connection between the plant simulator and the first processor simulator, such that the virtual connection is a direct co-simulation connection employing shared memory. The one or more physical computing devices may be further programmed to configure the virtual connection between the processor simulators as a co-simulation bus that uses TCP/IP.

Figure 22:
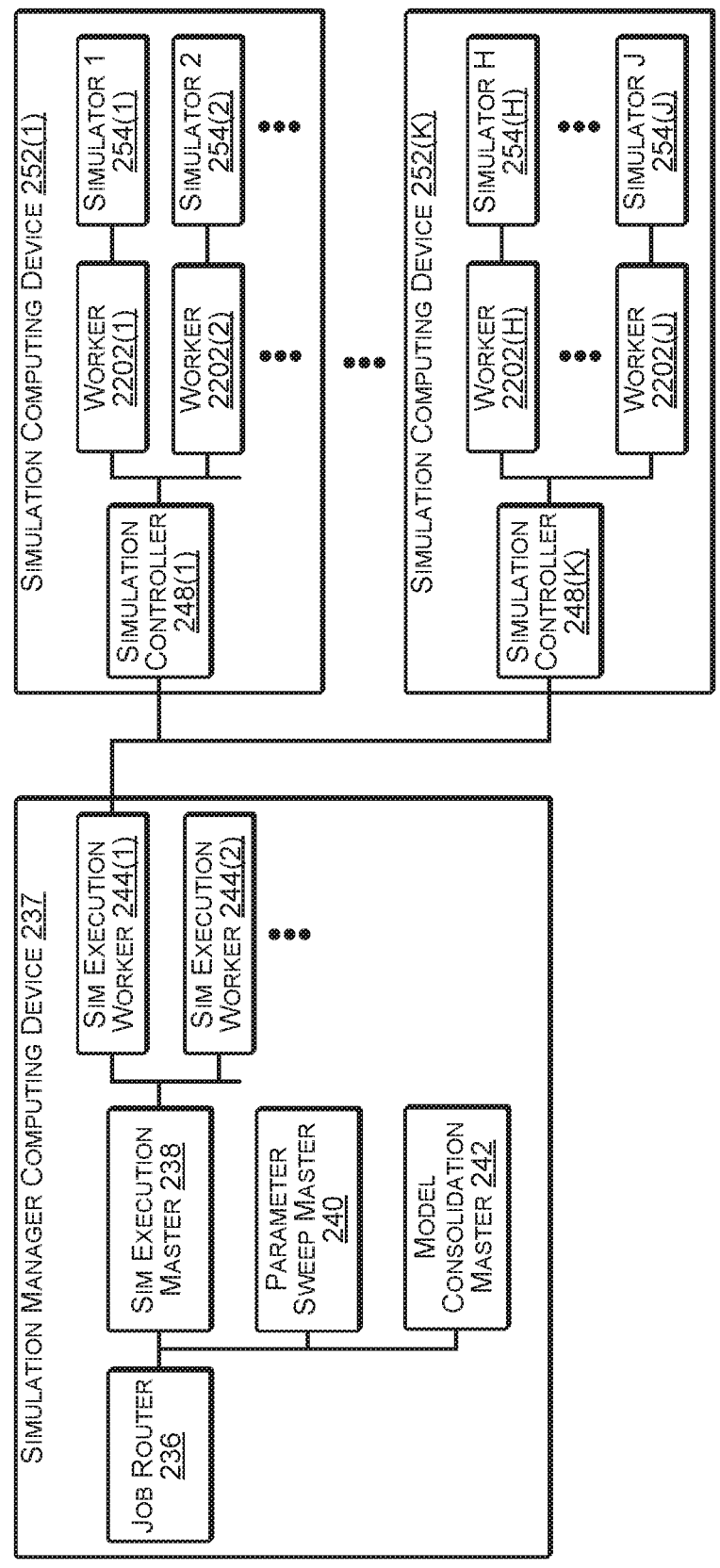
FIG. 22 illustrates an example arrangement including a simulation manager computing device and simulation computing devices according to some implementations.

FIG. 22 illustrates an example arrangement 2200 including a simulation manager computing device and a plurality of simulation computing devices according to some implementations. Furthermore, as mentioned above, some or all of the simulation computing devices 252 and/or the simulation manager computing device 237 may be virtual machines, or alternatively, some or all of these computing devices may be separate physical computing devices. The job router 236 may forward a new simulation job to the simulation execution master 238 based at least partly on job type, job parameters, available licenses, and/or available computing resources.

The simulation execution master 238 may delegate the job to a simulation execution worker 244(1), which may be one of a plurality of simulation execution workers, 244(1), 244(2), . . . , each configured for executing a separate simulation job. In some examples, the parameter sweep master 240 may determine the parameters to be used for the simulation job prior to the simulation execution master 238 providing the simulation job to the simulation execution worker 244(1). Additionally, or alternatively, the model consolidation master 242 may consolidate one or more models to be used by the simulation job prior to the simulation execution master 238 providing the simulation job to the simulation execution worker 244(1).

The simulation execution worker 244(1) may allocate one or more simulation computing devices 252 as computing resources to be used for executing the simulation, such as based on the number of simulators required for the simulation. Further, the simulation execution worker 244(1) may set up a simulation controller 248 on each allocated simulation computing device 252, respectively, for controlling the simulation job on the respective simulation computing device 252. For example, the simulation execution worker 244 may allocate a plurality of virtual machines as the simulation computing devices 252(1)-252(K) to execute simulators 254(1)-254(J) for the simulation job. Each simulator 254 may include or may access one or more model files (not shown in FIG. 22). Thus, in this example, suppose that simulators 254(1), 254(2), . . . are to be executed on the simulation computing device 252(1), and that simulators 245(H)-254(J) are to be executed on the simulation computing device 252(K). When participating in the simulation, each simulation controller 248 reports to and receives commands from the simulation execution worker 244(1).

The simulation controller 248 on each simulation computing device 252 may set up a separate worker process 2202 for each separate simulator 254 that will be executed on the respective simulation computing device 252. Thus, the simulation controller 248(1) may set up worker processes 2202(1), 2202(2), . . . for the simulators 254(1), 254(2), . . . , respectively. The simulation controller 248(K)

may set up worker processes 2202(H) . . . 2202(J) for the simulators 254(H) . . . 254(J), respectively. In addition, the simulation controller 248 may obtain one or more model files from a storage location for execution by each respective simulator 254 controlled by that simulation controller 248. For example, the simulation controller 248(1)-248(K) may request the model files identified in the simulation job information from a specified storage location. Through the worker processes 2202, the simulation controller 248 may launch, monitor, terminate, and clean up the workspaces of all simulators 254 executing on the respective simulation computing device 252 during a co-simulation. In addition, during the launching, monitoring, and termination of the simulators 254, each simulation controller 248 may send reports to the simulation execution worker 244(1), which coordinates or otherwise instructs the simulation process across all participating simulation computing devices 252.

As one example, if one of the simulators fails, the corresponding simulation controller 248 may notify the simulation execution worker 244(1) of the failure so that the simulation execution worker 244(1) may shutdown the remainder of the simulation and release the computing resources for other uses until the simulation can be corrected, restarted, or the like. Alternatively, the execution worker 244(1) may determine that the failure occurred after the execution of the particular model on the failed simulator was complete, and may continue execution of the other parts of the simulation. Thus, the simulation execution worker 244(1) may manage the execution of the simulation across all participating simulation computing devices 252(1)-252 (K).

Figure 23:
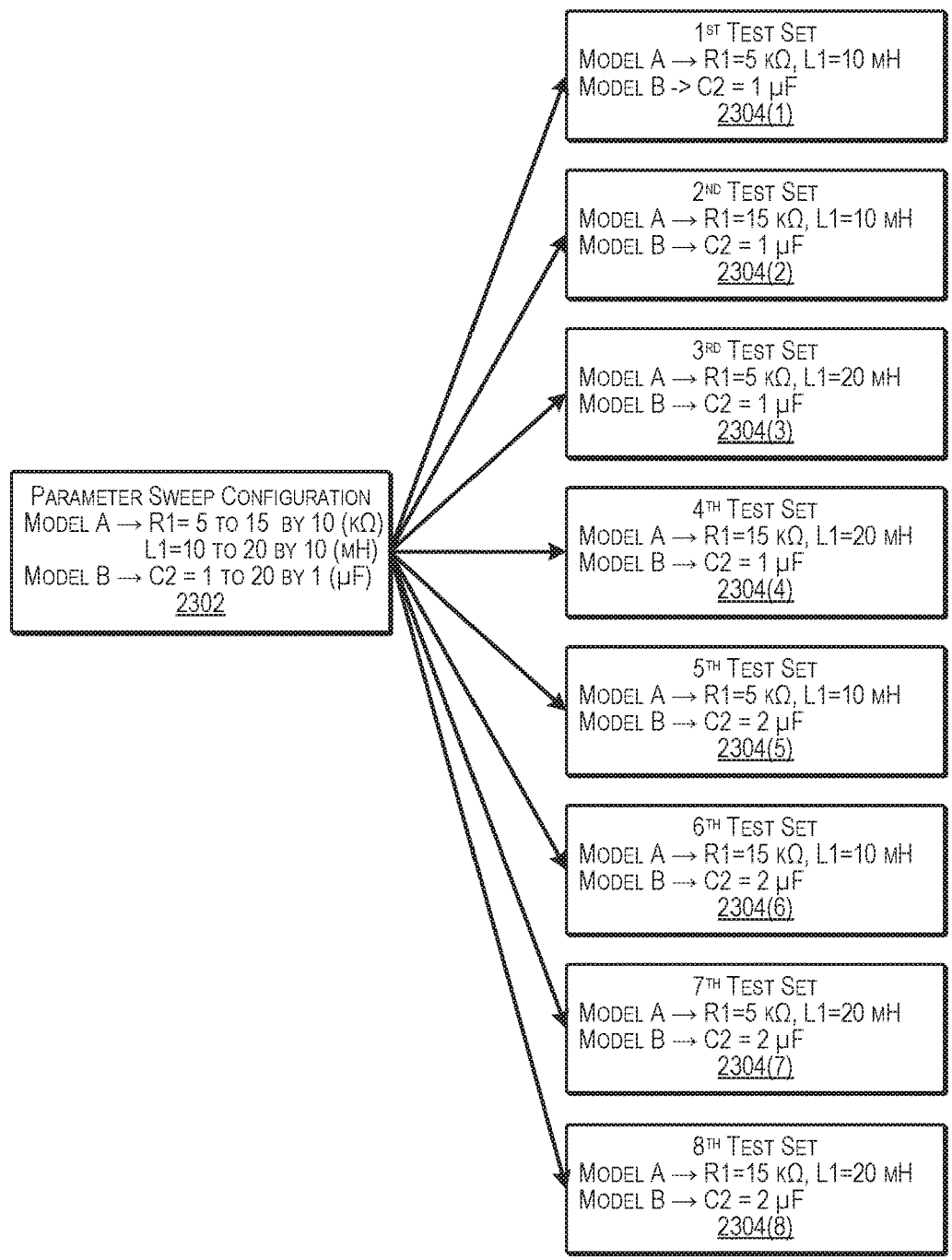
FIG. 23 illustrates an example of parameter sweep information in relation to parameter test sets according to some implementations.

FIG. 23 illustrates an example 2300 of parameter sweep information in relation to parameter test sets according to some implementations. In this example, supposed that the user would like to test a simulated system using different sets of parameters for determining, e.g., the optimal performance for the simulated system. For instance, suppose that the user may desire to establish parameter sets for multiple models built for a plurality of different simulators provided by different simulator vendors. Thus, the user may specify, for particular models to be executed on particular simulators, sets of parameters through which the simulation may sweep or otherwise traverse. For example, the user may set up a parameter sweep that will automatically instantiate models with given parameter sets in the form of at least one of (1) a range with an incremental step size, or (2) a discrete list of values to be tested.

In the example of FIG. 23, suppose that the user has set up a parameter sweep configuration 2302 for model A and model B that are included in a simulation that may or may not include other models and simulators. For instance, model A may include two or more parameters. Two of these parameters are configured for a parameter sweep, namely parameter R1 is configured to sweep from 5 kΩ to 15 kΩ in increments of 10 kΩ, and parameter L1 is configured to sweep from 10 mH to 20 mH in increments of 10 mH. In addition, model B may include one or more parameters. One of these parameters, parameter C2, is configured to sweep from 1 µF to 2 µF in increments of 1 µF. Based on these inputs from the user, the simulation platform may determine a plurality of parameter test sets based on the different ranges and the different increments. In the illustrated example, eight test sets 2304(1)-2304(8) are determined, each of which includes a different set of parameters to test in the simulation. In other examples, such as in the case of smaller increments or larger ranges, a much larger number of test sets may be determined for testing all the possible combinations of the parameters R1, L1, and C2.

Furthermore, in some examples, the simulation platform herein may automatically execute models instantiated with different parameter sets in parallel, such as by deploying these different parameter sets onto simulators instantiated on different virtual machines. In addition, the simulation platform may support cross-vendor, multiple-model parameter sweeps performed during co-simulations. For instance, the simulation platform may enable a sweep of X values of a first parameter in model A made by a first simulator, together with a sweep of Y values of a second parameter in model B made by a second simulator, together with a sweep of Z values of a third parameter in model C made by a third simulator, and so forth. Thus, the simulation platform may generate X×Y×Z number of executions to test out the possible combinations of the three parameters to be swept. Further, as illustrated in FIG. 23, the simulation platform may perform a sweep of more than one parameter in each model and/or of parameters of multiple models in co-simulations.

Figure 24:
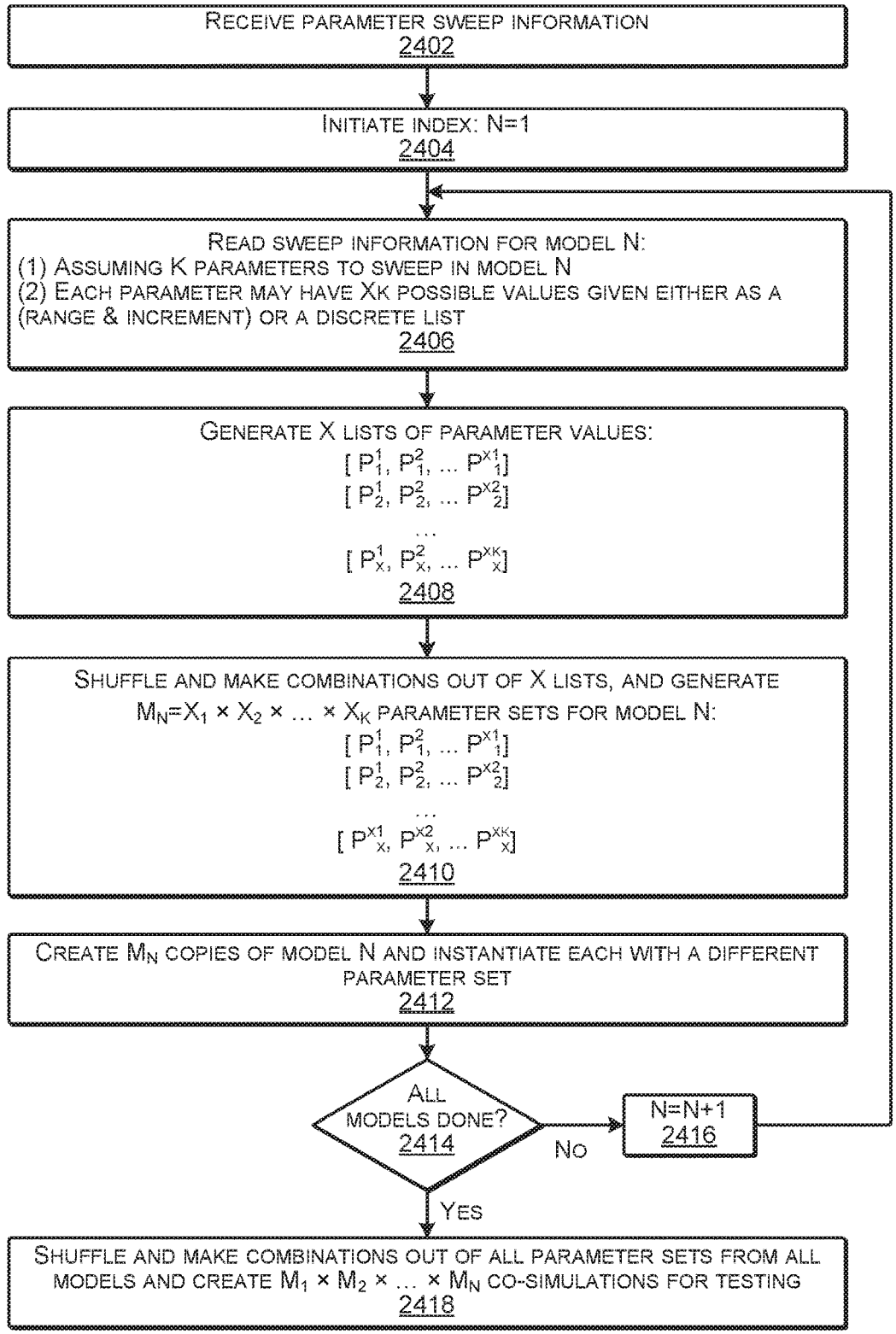
FIG. 24 is a flow diagram illustrating an example process for executing a simulation including a parameter sweep according to some implementations.

FIG. 24 is a flow diagram illustrating an example process 2400 for executing a simulation including a parameter sweep according to some implementations. The process 2400 may be executed by one or more computing devices associated with the network computing resources, or other suitable computing devices. As one example, at least a portion of the process 2400 may be performed by execution of the parameter sweep master 240 discussed above with respect to FIGS. 2 and 22.

At 2402, the one or more computing devices may receive parameter sweep information for use in execution of a simulation. For instance, the parameter sweep information may include, for each parameter selected to be swept, at least one of: a range and an increment for the parameter; or a set of values for the parameter.

At 2404, the one or more computing devices may initiate and index, such as N=1.

At 2406, the one or more computing devices may read the sweep information for a selected model N, and assuming K parameters to sweep in model N, each parameter to sweep may have Xk possible values given either as a (range & increment) or a discrete list.

At 2408, the one or more computing devices may generate X lists of parameter values for parameter P, such as based on the applicable (range & increment) or discrete list.

At 2410, the one or more computing devices may shuffle and make combinations out of X lists, and generate $M_N = X_1 \times X_2 \times \ldots \times X_K$ parameter sets for model N.

At 2412, the one or more computing devices may create $M_N$ copies of model N and instantiate each with a different parameter set.

At 2414, the one or more computing devices may determine if all models for which parameter sweep information has been received have been processed.

At 2416, if all models for which parameter sweep information has been received have not been processed, the one or more computing devices may increment the index N and process the next model.

At 2418, on the other hand, if all models for which parameter sweep information has been received have been processed, the one or more computing devices may shuffle and make combinations out of all parameter sets from all models and create $M_1 \times M_2 \times \ldots \times M_N$ co-simulations for testing.

Figure 25:
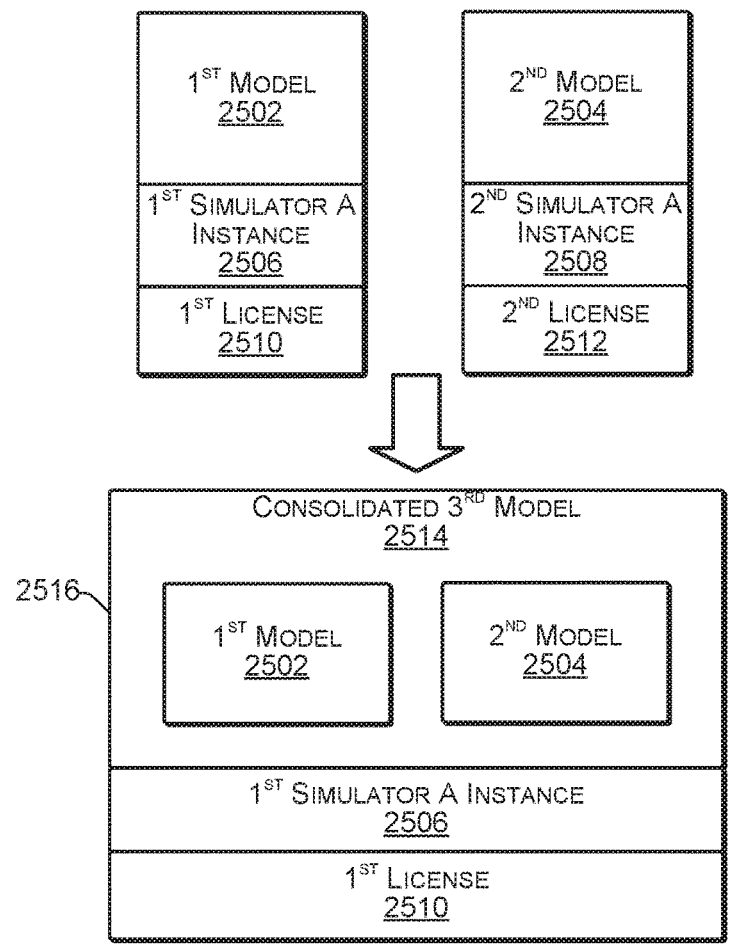
FIG. 25 illustrates an example of model consolidation according to some implementations.

FIG. 25 illustrates an example 2500 of model consolidation according to some implementations. As mentioned above, some implementations herein may enable the use of proprietary simulators that require payment of a license fee, such as payment for each use of the simulator, for use of the simulator over a specified time period, or the like. For example, when executing a simulation, a model may be executed on the simulator for a period until a final result is generated. During this execution period, the executing simulator may occupy a corresponding license exclusively. Therefore, other users may have to wait for a license to become available before being able to execute their own simulations. Further, when performing co-simulations, multiple types and copies of simulators may be used, and it may occur that a user, such as an individual, a company, a group of users, or other entity, may not have a large enough number of licenses to execute a large-scale simulation or other desired simulation. In some examples herein, rather than having to buy additional licenses, the user may be able to merge or otherwise consolidate a plurality of smaller models into a single larger model, thereby reducing the number of licenses required for executing the simulation. Accordingly, consolidation may make it possible to execute a large co-simulation with multiple models using the same simulator, even if there is only one license available. In addition, even when the number of available licenses is sufficient, model consolidation may reduce the unnecessary consumption of licenses and may help improve overall efficiency by making licenses that would be unnecessarily consumed available to other users.

As illustrated in FIG. 25, suppose that a first model 2502 and a second model 2504 have been configured for a particular simulation, and that the first model 2502 and the second model 2504 use the same simulator A. Therefore, the first model 2502 and the second model 2504 both require a license to use simulator A for execution. If model consolidation is not performed, the first model 2502 may be executed by a first simulator A instance 2506, and may use a first license 2510 for the first simulator A instance. Similarly, the second model 2504 may be executed by a second simulator A instance 2508 and may use a second license 2512 for the second simulator A instance.

In some examples, the first model 2502 and the second model 2504 may be consolidated into a consolidated third model 2514. For example, the consolidation may include identifying models that can use the same license, such as by using the same simulator for execution. The headers may be removed from the models being consolidated and the model cores may be placed in a wrapper 2516 that enables execution of the multiple models, at least one of sequentially, alternately, or in parallel, which may depend at least partially on the capabilities of the simulator.

Figure 26:
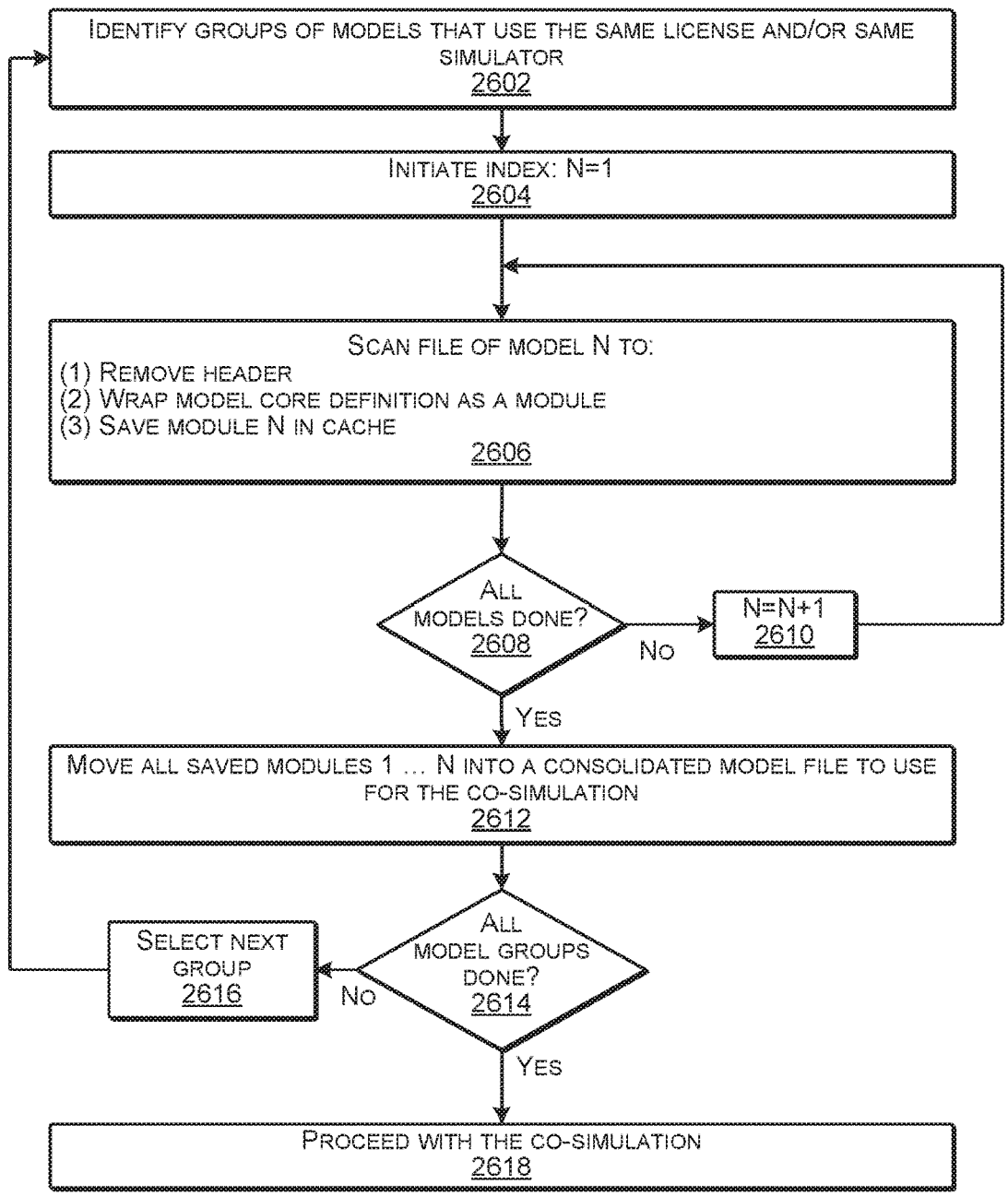
FIG. 26 is a flow diagram illustrating an example process for model consolidation according to some implementations.

FIG. 26 is a flow diagram illustrating an example process 2600 for model consolidation according to some implementations. The process 2600 may be executed by one or more computing devices associated with the network computing resources, or other suitable computing devices. As one example, at least a portion of the process 2600 may be performed by execution of the model consolidation master 242 discussed above with respect to FIGS. 2 and 22.

At 2602, the one or more computing devices may identify groups of models that may use the same license and or the same simulator. For example, the computing devices may determine a first group of two or more models that use a first license and/or a first simulator, a second group of two more other models that use a second license and/or a second simulator, and so forth. As one example, the models themselves may include information about the simulator version(s) with which each model is compatible, and models that are compatible with the same simulator versions may generally be presumed to be able to be consolidated.

At 2604, the one or more computing devices may initiate an index N=1.

At 2606, the one or more computing devices may scan the model file of model N to: (1) remove the header, (2) wrap the model core definition as a module of a consolidated model, and (3) save the module N, such as in a cache. In some examples, scanning the model file may include determining a list of components and connections for each model so that the inputs to and outputs from each model within the consolidated model may be properly directed.

At 2608, the one or more computing devices may determine if all models for the same license have been processed.

At 2610, if all models for the same license have not been processed, the one or more computing devices may increment the index N by one to process the next model N.

At 2612, if all models for the same license have been processed, the one or more computing devices may move all saved modules 1 to N into the consolidated model file to use for the co-simulation.

At 2614, the one or more computing devices may determine if there are other groups of models that may be consolidated for other licenses and/or simulators.

At 2616, if there are other model groups that may be consolidated for other licenses and/or simulators, the one or more computing devices may repeat blocks 2602-2610 for the next model group.

At 2618, if there are no other model groups that may be consolidated for other licenses and/or simulators, the one or more computing devices may proceed with execution of the co-simulation using the one or more consolidated models.

Figure 27:
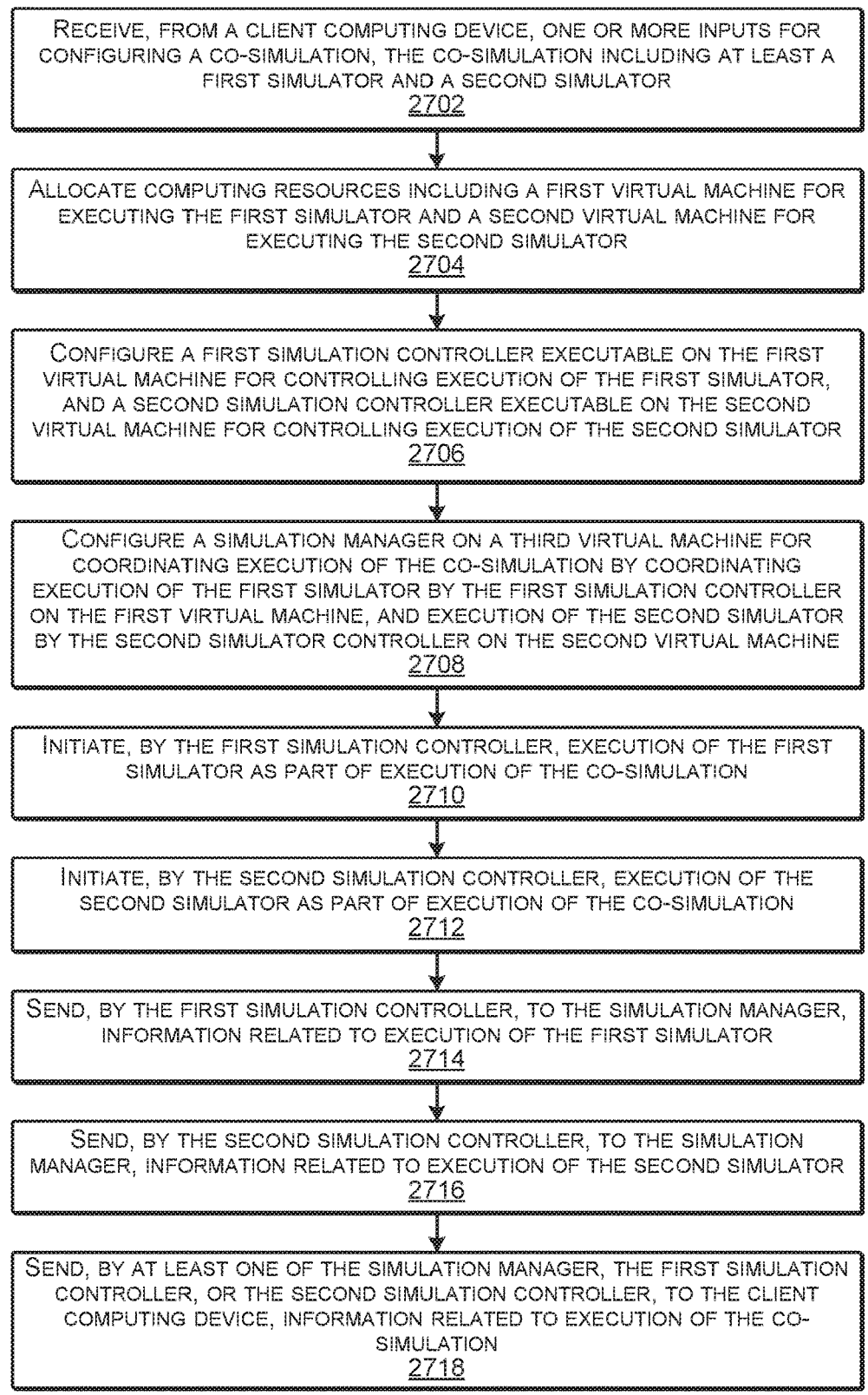
FIG. 27 is a flow diagram illustrating an example process for executing a simulation according to some implementations.

FIG. 27 is a flow diagram illustrating an example process 2700 for executing a simulation including multiple simulators according to some implementations. The process 2700 may be executed by one or more computing devices associated with the network computing resources, or other suitable computing devices.

At 2702, the one or more computing devices may receive, from a client computing device, one or more inputs for configuring a co-simulation, the co-simulation including at least a first simulator and a second simulator. For instance, the one or more inputs may be received via a GUI presented on the client computing device.

At 2704, the one or more computing devices may allocate computing resources including a first virtual machine for executing the first simulator and a second virtual machine for executing the second simulator. In other examples, a single virtual machine is allocated for both the first simulator and the second simulator.

At 2706, the one or more computing devices may configure a first simulation controller executable on the first virtual machine for controlling execution of the first simulator, and a second simulation controller executable on the second virtual machine for controlling execution of the second simulator. Alternatively, if a single virtual machine is allocated, the first simulation controller may control execution of both the first simulator and the second simulator.

At 2708, the one or more computing devices may configure a simulation manager on a third virtual machine for instructing execution of the co-simulation by instructing execution of the first simulator by the first simulation controller on the first virtual machine, and execution of the second simulator by the second simulator controller on the second virtual machine. For example, the simulation manager may include a simulation execution worker that coordinates, manages, or otherwise instructs the execution of the simulation. By having multiple simulation execution workers, multiple unrelated simulations may be executed by the simulation platform concurrently.

At 2710, the first simulation controller may initiate execution of the first simulator as part of execution of the co-simulation.

At 2712, the second simulation controller may initiate execution of the second simulator as part of execution of the co-simulation.

At 2714, the first simulation controller may send, to the simulation manager, information related to execution of the first simulator.

At 2716, the second simulation controller may send, to the simulation manager, information related to execution of the second simulator.

At 2718, at least one of the simulation manager, the first simulation controller, or the second simulation controller, may send, to the client computing device, information related to execution of the co-simulation.

The example processes described herein are only examples of processes provided for discussion purposes. Numerous other variations will be apparent to those of skill in the art in light of the disclosure herein. Further, while the disclosure herein sets forth several examples of suitable frameworks, architectures and environments for executing the processes, the implementations herein are not limited to the particular examples shown and discussed. Furthermore, this disclosure provides various example implementations, as described and as illustrated in the drawings. However, this disclosure is not limited to the implementations described and illustrated herein, but can extend to other implementations, as would be known or as would become known to those skilled in the art.

Various instructions, processes, and techniques described herein may be considered in the general context of computer-executable instructions, such as program modules stored on computer-readable media, and executed by the processor(s) herein. Generally, program modules include routines, programs, objects, components, data structures, executable code, etc., for performing particular tasks or implementing particular abstract data types. These program modules, and the like, may be executed as native code or may be downloaded and executed, such as in a virtual machine or other just-in-time compilation execution environment. Typically, the functionality of the program modules may be combined or distributed as desired in various implementations. An implementation of these modules and techniques may be stored on computer storage media or transmitted across some form of communication media.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed:

1. A system comprising:
one or more processors; and
one or more non-transitory computer-readable media maintaining executable instructions, which, when executed by the one or more processors, program the one or more processors to perform operations comprising:
receiving, from a client computing device, one or more inputs for configuring a co-simulation, the co-simulation including at least a first virtual electronic control unit (vECU) as a first simulator and a second vECU as a second simulator;
allocating computing resources including at least a first virtual machine that executes the first vECU, a second virtual machine that executes the second vECU, and a third virtual machine that executes a third vECU, wherein a virtual controller area network (CAN) router is executed on the third vECU, the virtual CAN router directing CAN communications on a virtual CAN bus that enables CAN communications between the first vECU and the second vECU;
executing the first vECU and the second vECU as part of execution of the co-simulation, wherein the virtual CAN router executed by the third vECU executed on the third virtual machine enables the first vECU and the second vECU to communicate using a CAN protocol, wherein at least the first vECU and the second vECU are assigned respective CAN identifiers (IDs) that are individually distinguishable from each other on the virtual CAN bus;
executing an emulator on a fourth virtual machine, the emulator sending emulated vehicle-level CAN traffic that simulates a plurality of electronic control units communicating over the virtual CAN router and virtual CAN bus, the emulated vehicle-level CAN traffic including sending, by the emulator, a plurality of frames of data, each frame of data that is sent including a payload containing data between a minimum amount of data and a maximum amount of data to simulate a real-world level of CAN network traffic while the first vECU and the second vECU at least one of send or receive CAN communications,
wherein the frames sent as the emulated vehicle-level CAN traffic on the virtual CAN bus are sent according to a periodic transmission pattern with one of a predefined value or a sequence of values for the frame payload size,
wherein the emulator is further configured to send, to the virtual CAN router, a CAN message including a simulated control signal for controlling at least one vehicle plant simulation controlled by at least one of the first vECU or the second vECU,
wherein the virtual CAN router routes the CAN message to the first vECU or the second vECU based on the respective CAN ID; and
sending a result of the co-simulation to the client computing device.

2. The system as recited in claim 1, the operations further comprising:
executing a first model on the first virtual machine, the first model simulating a first vehicle plant as the at least one vehicle plant simulation;
executing a first simulated controller on the first vECU executed on the first virtual machine for providing signals to the first vehicle plant simulated by the first model; and
configuring a direct co-simulation interface between the first vECU and the first model, the direct co-simulation interface including shared memory provided by the first virtual machine to enable direct communication of the signals between the vECU and the first model.

3. The system as recited in claim 1, further comprising configuring a simulation manager for instructing execution of the co-simulation by instructing execution of first vECU by a first simulation controller on the first virtual machine, and execution of the second vECU by a second simulator controller on the second virtual machine.

4. The system as recited in claim 1, the operations further comprising:
receiving first parameter sweep information including at least one of:
a range and an increment for a first parameter for a first model executable on the first simulator; or
a list of parameter values for the first parameter for the first model executable on the first simulator;
receiving second parameter sweep information including at least one of:
a range and an increment for a second parameter for a second model executable on the second simulator; or
a list of parameter values for the second parameter for the second model executable on the second simulator; and
determining a plurality of sets including combinations of a plurality of first values for the first parameter and a plurality of second values for the second parameter for executing a plurality of the co-simulations.

5. The system as recited in claim 4, the operations further comprising:
allocating a plurality of virtual machines for executing a plurality of instances of the first simulator and a plurality of instances of the second simulator; and
executing at least some of the plurality of the co-simulations in parallel using different combinations of at least some of the first values and the second values.

6. The system as recited in claim 1, the operations further comprising:
determining, for the co-simulation, a first model for execution on the first simulator and a second model for execution on another instance of the first simulator;
consolidating the first model and the second model into a consolidated model; and
executing the consolidated model on the first simulator as part of the co-simulation.

7. The system as recited in claim 6, wherein consolidating the first model and the second model comprises:
determining that the first model and the second model are executable on a same simulator;
removing a header portion from code of a first model file of the first model and removing a header portion from code of a second model file of the second model; and
adding the code of the first model file and the code of the second model file to the consolidated model file to enable at least one of sequential execution, alternate execution, or parallel execution of the code of the first model file and the code of the second model file.

8. The system as recited in claim 1, the operations further comprising:
prior to receiving the one or more inputs from the client computing device, sending, to the client computing device, information for presenting a graphic user interface (GUI) on the client computing device, the GUI including virtual controls to enable selection of a configuration of the co-simulation; and
receiving, from the client computing device, via the GUI, the one or more inputs for configuring the co-simulation.

9. The system as recited in claim 8, the operations further comprising:
receiving, from the client computing device, via the GUI, an indication of a connection type between the first simulator and the second simulator wherein the GUI enables selection of connection types including the virtual CAN bus or a virtual signal bus; and
configuring the virtual CAN bus or the virtual signal bus between the first simulator and the second simulator based on the indication of the connection type.

10. The system as recited in claim 8, the operations further comprising:
receiving, from the client computing device, via the GUI, time information indicating at least an end time for the co-simulation;
receiving, from the client computing device, via the GUI, an instruction requesting execution of the co-simulation; and
at least partially in response to receiving the instruction, executing the co-simulation according to the time information.

11. A method comprising:
receiving, by one or more processors, from a client computing device, an instruction to create a simulation including a first simulator and a second simulator;
receiving, by the one or more processors, from the client computing device, an indication of a first model file executable on the first simulator and a second model file executable on the second simulator, wherein the first model file comprises a first virtual electronic control unit (vECU) and the second model file comprises a second vECU;
executing by the one or more processors, the simulation by executing the first model file including the first vECU on the first simulator, executing the second model file including the second vECU on the second simulator, and executing a third model file including a third vECU on a third simulator;
executing, by the one or more processors, a virtual controller area network (CAN) router on the third vECU, the virtual CAN router directing CAN communications on a virtual CAN bus that enables CAN communications between the first vECU and the second vECU; and
executing, by the one or more processors, an emulator that sends emulated vehicle-level CAN traffic that simulate a plurality of electronic control units communicating over the virtual CAN router and virtual CAN bus, the emulated vehicle-level CAN traffic including a plurality of frames of data, each frame of data that is sent including a payload containing data between a minimum amount of data and a maximum amount of data to simulate a real-world level of CAN network traffic while the first vECU and the second vECU at least one of send or receive CAN communications, wherein the frames sent as the emulated vehicle-level CAN traffic on the virtual CAN bus are sent according to a periodic transmission pattern with one of a predefined value or a sequence of values for the frame payload size,
wherein:
at least the first vECU and the second vECU are assigned respective CAN identifiers (IDs) that are individually distinguishable from each other on the virtual CAN bus,
the emulator is further configured to send, to the virtual CAN router, a CAN message including a simulated control signal for controlling at least one vehicle plant simulation controlled by at least one of the first vECU or the second vECU, and
the virtual CAN router routes the CAN message to the first vECU or the second vECU based on the respective CAN ID.

12. The method as recited in claim 11, further comprising:
configuring a first simulation controller for controlling execution of the first simulator and the first model file; and
configuring a second simulation controller for controlling execution of the second simulator and the second model file.

13. The method as recited in claim 11, further comprising:
receiving first parameter sweep information including at least one of:
  a range and an increment for a first parameter for the first model file; or
  a list of parameter values for the first parameter for the first model file;
receiving second parameter sweep information including at least one of:
  a range and an increment for a second parameter for the second model file; or
  a list of parameter values for the second parameter for the second model file; and
determining a plurality of sets including combinations of a plurality of first values for the first parameter and a plurality of second values for the second parameter for executing a plurality of the simulations.

14. A system comprising:
one or more physical computing devices and a storage, wherein the one or more physical computing devices are programmed to:
  receive, from a client computing device, an indication of a simulation including a first virtual electronic control unit (vECU) as first simulator and a second vECU as a second simulator;
  execute the first vECU, the second vECU, and a third vECU;
  execute a virtual controller area network (CAN) router on the third vECU, the virtual CAN router directing CAN communications on a virtual CAN bus that enables CAN communications using a CAN protocol between the first vECU and the second vECU, wherein at least the first vECU and the second vECU are assigned respective CAN identifiers (IDs) that are individually distinguishable from each other on the virtual CAN bus; and
  execute an emulator configured to send vehicle-level CAN traffic that simulates a plurality of electronic control units communicating over the virtual CAN router and virtual CAN bus, the emulated vehicle-level CAN traffic including sending a plurality of frames of data, each frame of data that is sent including a payload containing data between a minimum amount of data and a maximum amount of data to simulate a real-world level of CAN network traffic while the first vECU and the second vECU at least one of send or receive CAN communications,
  wherein the emulator is further configured to send, to the virtual CAN router, a CAN message including a simulated control signal for controlling at least one vehicle plant simulation controlled by at least one of the first vECU or the second vECU, and
  wherein the virtual CAN router routes the CAN message to the first vECU or the second vECU based on the respective CAN ID.

15. The system as recited in claim 14, wherein the one or more physical computing devices are programmed to:
  configure a first simulation controller for controlling execution of the first vECU; and
  configure a second simulation controller for controlling execution of the second vECU.

16. The system as recited in claim 14, wherein the frames sent as the emulated vehicle-level CAN traffic on the virtual CAN bus are sent according to a periodic transmission pattern with one of a predefined value or a sequence of values for the frame payload size.

17. The system as recited in claim 14, wherein the one or more physical computing devices are further programmed to:
  receive first parameter sweep information including at least one of:
    a range and an increment for a first parameter for the first vECU; or
    a list of parameter values for the first parameter for the first vECU; and
  determining a plurality of values for the first parameter for executing in parallel a plurality of simulations using at least some of the plurality of values.

18. The system as recited in claim 14, wherein the one or more physical computing devices are further programmed to:
  determining that a first model and a second model are executable on the first simulator; and
  consolidating the first model and the second model into a consolidated model.

19. The system as recited in claim 14, the operations further comprising:
  prior to receiving the indication from the client computing device, sending, to the client computing device, information for presenting a graphic user interface (GUI) on the client computing device, the GUI including virtual controls to enable selection of a configuration of the simulation;
  receiving, from the client computing device, via the GUI, an indication of a connection type between the first simulator and the second simulator, wherein the GUI enables selection of connection types including the virtual CAN bus or a virtual signal bus; and
  configuring the virtual CAN bus or the virtual signal bus between the first simulator and the second simulator based on the indication of the connection type.

* * * * *